United States Patent
Fujikawa

(10) Patent No.: US 9,013,391 B2
(45) Date of Patent: Apr. 21, 2015

(54) OUTPUT CONTROL CIRCUIT, SCANNING LINE DRIVING CIRCUIT OF ELECTRO-OPTIC DEVICE, ELECTRO-OPTIC DEVICE AND ELECTRONIC APPARATUS

(71) Applicant: Seiko Epson Corporation, Tokyo (JP)

(72) Inventor: Shinsuke Fujikawa, Chino (JP)

(73) Assignee: Seiko Epson Corporation, Tokyo (JP)

( * ) Notice: Subject to any disclaimer, the term of this patent is extended or adjusted under 35 U.S.C. 154(b) by 169 days.

(21) Appl. No.: 13/789,297

(22) Filed: Mar. 7, 2013

(65) Prior Publication Data

US 2013/0241812 A1  Sep. 19, 2013

(30) Foreign Application Priority Data

Mar. 13, 2012  (JP) .................................. 2012-055389

(51) Int. Cl.
*G09G 3/36* (2006.01)
*G09G 5/00* (2006.01)
*H03K 3/015* (2006.01)
*G09G 3/20* (2006.01)

(52) U.S. Cl.
CPC ............... *G09G 5/003* (2013.01); *H03K 3/015* (2013.01); *G09G 2310/0286* (2013.01); *G09G 3/2022* (2013.01); *G09G 3/3677* (2013.01); *G09G 2310/0216* (2013.01); *G09G 2310/08* (2013.01)

(58) Field of Classification Search
None
See application file for complete search history.

(56) References Cited

U.S. PATENT DOCUMENTS

| | | | | |
|---|---|---|---|---|
| 7,697,656 B2 * | 4/2010 | Katayama | ........................ | 377/70 |
| 8,432,343 B2 * | 4/2013 | Hong | ............................... | 345/87 |
| 2002/0190326 A1 * | 12/2002 | Nagao et al. | ................... | 257/359 |
| 2004/0150610 A1 * | 8/2004 | Zebedee et al. | ................ | 345/100 |
| 2005/0099379 A1 | 5/2005 | Iisaka | | |
| 2005/0285824 A1 * | 12/2005 | Shin | ................................ | 345/76 |
| 2006/0044230 A1 * | 3/2006 | Eom | ................................. | 345/76 |
| 2006/0158395 A1 * | 7/2006 | Kubota et al. | .................... | 345/76 |
| 2006/0262483 A1 * | 11/2006 | Osame | .......................... | 361/500 |
| 2008/0278468 A1 | 11/2008 | Hosaka et al. | | |
| 2009/0231311 A1 * | 9/2009 | Shin | ................................ | 345/205 |
| 2009/0267924 A1 * | 10/2009 | Shimizu et al. | ................ | 345/204 |
| 2010/0007649 A1 * | 1/2010 | Tanikame et al. | .............. | 345/213 |
| 2010/0156858 A1 * | 6/2010 | Moon et al. | .................... | 345/204 |

* cited by examiner

*Primary Examiner* — Antonio Xavier
(74) *Attorney, Agent, or Firm* — ALG Intellectual Property, LLC

(57) ABSTRACT

An output control circuit is configured to have a first circuit which includes a NOT circuit, a NAND circuit and a transmission gate as a first sub circuit, and a second circuit which includes a NAND circuit as a second sub circuit. The NAND circuit controls a transmission to the NAND circuit of the enable signal by the transmission gate based on signal which has been logic reversed by the NOT circuit and the NAND circuit.

12 Claims, 17 Drawing Sheets

<CONFIGURATION OF FIELD>

Enb DELAYED

Enb UNDELAYED

OUTPUT CONTROL CIRCUIT, SCANNING LINE DRIVING CIRCUIT OF ELECTRO-OPTIC DEVICE, ELECTRO-OPTIC DEVICE AND ELECTRONIC APPARATUS

BACKGROUND

1. Technical Field

The present invention relates to, for example, an output control circuit and the like appropriately used in an electro-optic device.

2. Related Art

An electro-optic device including a liquid display device or organic EL (electro-luminescence) device or the like is generally configured to have a pixel corresponding to an intersection between a scanning line and a data line. According to such electro-optic device, for preventing a write failure or a display defect and the like, a technology which provides a logical product signal of a pulse signal sequentially output from, for example, a shift register and any one of a plurality of enable signals to a scanning line as a scanning signal has been suggested (for example, see JP-A-2004-177930).

However, according to the related art, when an enable signal is not slightly delayed due to some reason with regard to, for example, a pulse signal, problems occur, such that a width of pulse in a scanning signal, that is, a write period becomes shorter, or a scanning signal is output at the timing when it is not assumed.

SUMMARY

An advantage of some aspects of the invention is to provide a technology for preventing such occurrence of problems.

According to an aspect of the invention, there is provided an electro-optic device including: a first circuit which includes a plurality of first sub circuits; and a second circuit which includes a plurality of second sub circuits, wherein one first sub circuit among the plurality of first sub circuits inputs one input signal and enable signal, one second sub circuit among the plurality of second sub circuits inputs the enable signal when the enable signal is transmitted from the one first sub circuit, the one second sub circuit outputs a first output signal, and the one first sub circuit inputs the first output signal.

According to the aspect of the invention, the first sub circuit inputs the input signal and the first output signal returned and transmits the enable signal to the second sub circuit, and since the second sub circuit outputs the first output signal based on the enable signal, it is possible to cause the first output signal of its own to be reflected as well as a state of the input signal and a state of the enable signal.

In the aspect of the invention, it is preferable that the other second sub circuit different from the one second sub circuit among the plurality of second sub circuits, inputs the first output signal. In the case of such a configuration, it is possible that the second sub circuit outputs the first output signal by causing a state of the output signal due to another second sub circuit to be reflected as well as the input signal and the enable signal.

In the aspect of the invention, it is preferable that the one first sub circuit include a logical circuit that inputs the one input signal and the one output signal, and a switch which takes either of two states of on or off state in response to an output signal of the logical circuit in the middle of the course where the enable signal is supplied to the second sub circuit. According to such an aspect, since the enable signal is transmitted to the second sub circuit through the switch, it is possible to cause a capacity to be hosted in the transmitting course to be decreased compared to a configuration that transmits the enable signal to a gate electrode of a transistor forming the logical circuit.

In the aspect of the invention, it is preferable that the one second sub circuit inhibits the one output signal from becoming an active level when the output signal of the other second sub circuit is at an active level. According to this, since the one second sub circuit inhibits the first output signal of its own to become an active level, it is possible to prevent the output signal and the like simultaneously become an active level when the output signal is at an active level by the other second sub circuit.

According to another aspect of the invention, there is provided an output control circuit including: A first circuit including a plurality of first sub circuits in which at least two first sub circuits among the plurality of first sub circuits inputs another input signal and enable signal; and a second circuit including a plurality of second sub circuits in which one second sub circuit among the plurality of second sub circuits inputs the enable signal when the enable signal is transmitted from either of the two first sub circuits, wherein a second sub circuit other than the one second sub circuit among the plurality of second sub circuits inputs an output signal from the one second sub circuit. According to such an output control circuit, one second sub circuit may cause each state to be reflected to an input signal, an enable signal transmitted from a first sub circuit and an output signal due to the other second sub circuit, thereby outputting a first output signal.

In such an output control circuit, it is preferable that one of the two first sub circuits inputs one of a first output signal output from the one second sub circuit and the another input signal. In the case of such a configuration, it is preferable that the one first sub circuit includes a logical circuit which outputs a second output signal based on one of the first output signal and the another input signal. In addition, in the case of such an embodiment, it is preferable that an input signal input to the logical circuit is a signal transmitted from a shift register.

Further, it is possible to conceive the invention as a scanning line driving circuit, electro-optic device, and an electronic apparatus including the electro-optic device as well as an output control circuit.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, description regarding embodiments of the invention will be given referring to drawings.

Figure 1:
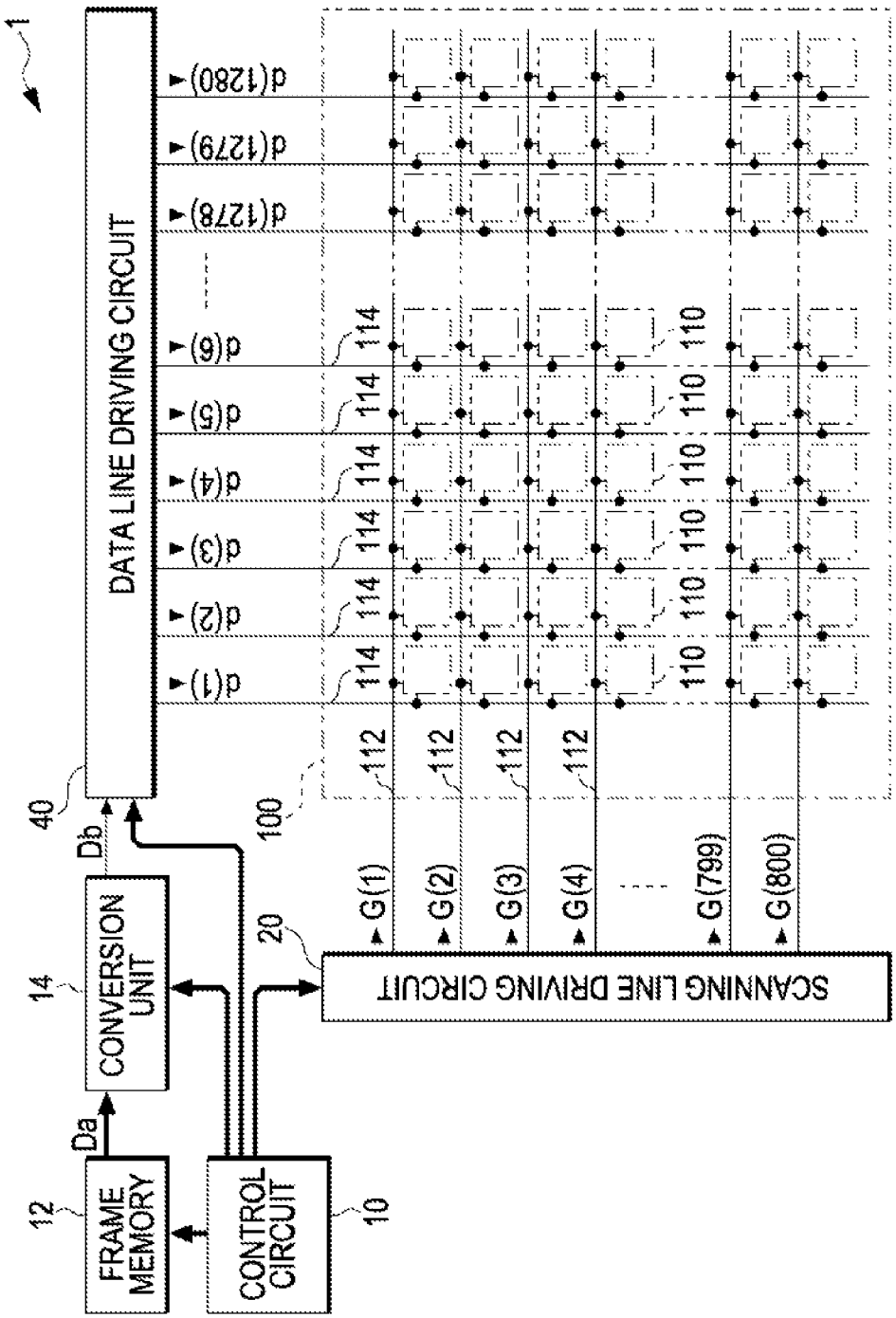
FIG. 1 is a view illustrating a configuration of an electro-optic device which includes an output control circuit according to an embodiment.

FIG. 1 is a block diagram illustrating the whole configuration of an electro-optic device 1 as an embodiment of an output control circuit.

As this figure shows, the electro-optic device 1 includes a control circuit 10, a frame memory 12, a conversion unit 14, a scanning line driving circuit 20, a data line driving circuit 40, and a display circuit 100. Among them, the control circuit 10 controls each component as described below.

The display circuit 100 is formed by arranging a pixel 110 in a matrix shape. Specifically, according to the embodiment, in the display circuit 100, scanning lines 112 of 800 rows in total extends in a lateral direction similar to the figure, and data lines 114 of 1,280 columns extends in a vertical direction similar to the figure while maintaining to be in a state of electrical insulation with scanning line 112. In addition, the pixel 110 is respectively provided so as to correspond to an intersection of such scanning line 112 and the data line 114. Thus, the pixel 110 according to the embodiment is arranged in a matrix shape with 1,280 columns and 800 rows.

Here, in order to distinguish scanning line 112 or row of the pixel 110 arranged in a matrix shape, these may be sequentially referred to as rows 1, 2, 3, 4, . . . , 799, 800 respectively from top as shown in the figure. Similarly, in order to distinguish the data line 114 or column of the pixel 110 arranged in a matrix shape, these may be sequentially referred to as rows 1, 2, 3, 4, . . . , 1279, and 1280 respectively from left as shown in the figure.

The frame memory 12 has a storage area which respectively corresponds to the pixel 110, and the storage area stores display data Da of the pixel 110 which corresponds thereto. Display data Da is to specify brightness (gradation level) of the pixel 110. This display data Da is transmitted from an upper device not shown, and is stored in a storage area which corresponds to the pixel 110 due to the control circuit 10. And display data Da is configured such that a display data which corresponds to a pixel scanned by the display circuit 100 is read therefrom.

The conversion unit 14 is to convert display data Da read from the frame memory 12 to data (bit) Db which shows whether the pixel 110 is driven to either of two states of on or off according to a gradation level specified by the display data Da and a sub field number notified from the control circuit 10.

The scanning line driving circuit 20 transmits scanning signal G(1) to scanning line 112 in the 1st row, and, hereinafter similarly, transmits each of scanning signal G(2), G(3), G(4), . . . , G(799), and G(800) to each of scanning line 112 in the 2nd, 3rd, 4th, . . . , 799th, and 800th rows. Here, the scanning line driving circuit 20 causes a scanning signal transmitted to a selected scanning line to become an H level which corresponds to a selected voltage, and causes a scanning signal transmitted to the scanning line other than the selected scanning line to become an L level which corresponds to an unselected voltage (grounding electric potential Gnd).

The data line driving circuit 40, when a certain j column is selected as an example, selects data Db which corresponds to a pixel of j column that has been selected by the scanning line driving circuit 20, and a voltage which corresponds to a write polarity specified by the control circuit 10, and transmits the data Db and the voltage to a data line 114 of jth column as data signal d (j). The data line driving circuit 40 executes such a transmission movement for each selected row of scanning line 112, that is, for the row across each of columns 1 to 1280. In addition, in the figure, data signals transmitted to each data line 114 of 1st, 2nd, 3rd, 4th, . . . , 1279th, and 1280th columns are referred to as d(1), d(2), d(3), d(4), . . . , d(1279), d(1280) respectively.

Figure 2:
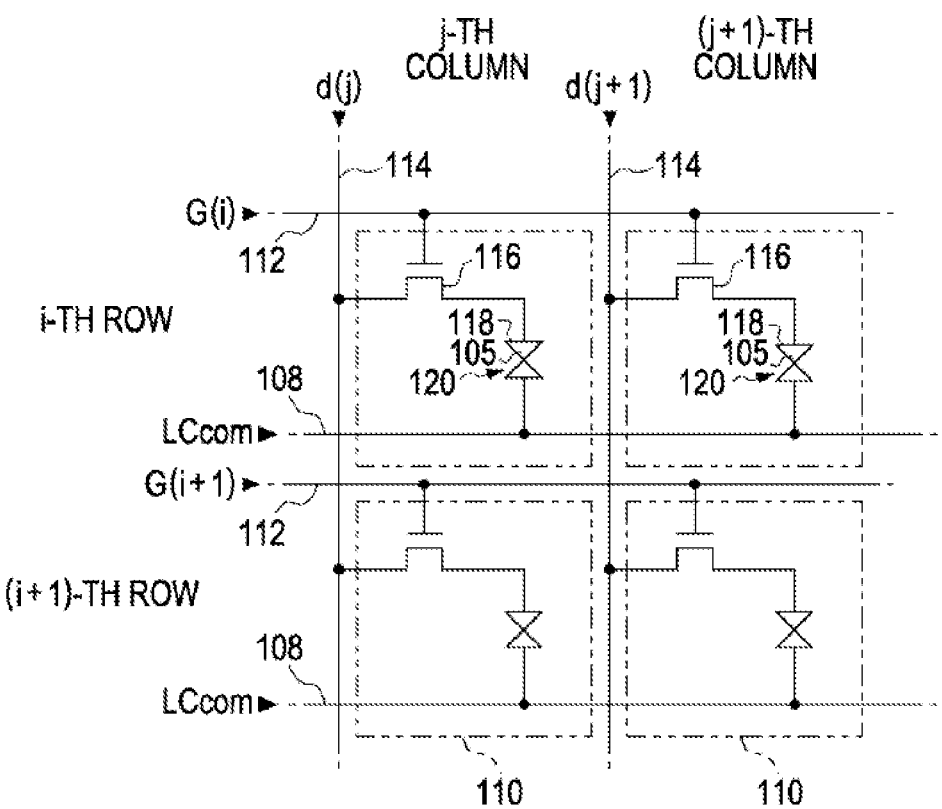
FIG. 2 is a view illustrating a pixel circuit of the electro-optic device.

FIG. 2 is a schematic view illustrating a specific configuration of the pixel 110, and shows a configuration of a total of 4 pixels, 2 pixels×2 pixels which correspond to an intersection of i row and (i+1) row adjacent thereto, and j column and (j+1) column adjacent thereto. Here, i and (i+1) are signs when generally representing rows, and, especially, i is assumed as an odd number (1, 3, 5, . . . , 797, 799), and (i+1) is assumed as an even number (2, 4, 6, . . . , 798, . . . , 800). In addition, j and (j+1) are signs when generally representing columns, and are integers from 1 to 1280.

As shown in FIG. 2, each pixel 110 includes an n channel type of a transistor (MOS-typed FET) 116 and liquid crystal element 120.

Here, since the same configuration is mutually applied to each pixel 110, when the pixel located in the i row and j column is selected for describing the configuration, a gate electrode of the transistor 116 in the pixel 110 in the i row and j column is connected to a scanning line 112 in the i-th row, a source electrode thereof is connected to the data line 114 in the jth column, and a drain electrode thereof is connected to a pixel electrode 118 as one end of liquid crystal element 120. In addition, the other end of liquid crystal element 120 is opposing electrode 108. Such opposing electrode 108 is the same across the entire pixel 110, and is maintained at voltage L Ccom in the embodiment.

Especially, notwithstanding it is not shown, the display circuit 100 is configured as follows: an element substrate in which the scanning line 112, the data line 114, the transistor 116, and the pixel electrode 118 or the like are formed, and an opposing substrate in which opposing electrode 108 is formed maintain a constant gap, surfaces which form electrode are laminated so as to face each other, and, therewith, such a gap is sealed with liquid crystal 105. Thus, liquid crystal element 120 according to the embodiment is configured to hold liquid crystal 105 therebetween as a dielectric with the pixel electrode 118 and opposing electrode 108.

Moreover, the embodiment uses a semiconductor substrate as an element substrate, uses a transparent substrate such as glass as an opposing substrate, and is of LCOS (Liquid Crystal on Silicon) type in which liquid crystal element 120 is of reflection type. Thus, an element substrate may be configured to internally store the control circuit 10, frame memory 12, or the conversion unit 14 as well as the scanning line driving circuit 20 and the data line driving circuit 40.

In such a configuration, when the transistor 116 is turned to a on state (conductive, closed) by applying a selected voltage (H level) to the scanning line 112, and a data signal is transmitted to the pixel electrode 118 through the data line 114 and the transistor 116 in the on state, a voltage which corresponds to a difference of a voltage of the data signal and voltage L Ccom which has been applied to opposing electrode 108 is written to liquid crystal element 120 which corresponds to an intersection of the scanning line 112 to which the selected voltage has been applied and the data line 114. Moreover, when the scanning line 112 becomes an unselected voltage (L level), the transistor 116 becomes an off state (nonconductive, open). However, in liquid crystal element 120, a voltage written when the transistor 116 became to a conductive state is maintained due to its capacity.

Further, as for a voltage described here, for example, an L level of unselected voltage that is applied to the scanning line 112 is set to 0 volts as a base voltage.

Liquid crystal element 120 according to the embodiment adopts a normal black mode. Thus, a reflectance of liquid crystal element 120 becomes darker while an effective value of an applied voltage which is a difference of a voltage of the pixel electrode 118 and a voltage of opposing electrode 108 becomes smaller, and becomes substantially black in a state to which a voltage is not applied. In the normal black mode, when a reflectance of the darkest state is set to 0%, a reflectance of the brightest state is set to 100%, normalization is made. At this time, in the voltage applied to liquid crystal element 120, a voltage in which a relative reflectance becomes to 10% is referred to as an optical threshold voltage, and a voltage in which a relative reflectance becomes to 90% is referred to as an optical saturation voltage.

In a voltage modulation scheme (analog driving), when liquid crystal element 120 is set to a half tone (gray), liquid crystal element 120 is designed so that a voltage of the optical threshold value or more and optical saturation value or less is applied. Thus, the reflectance of liquid crystal element 120 becomes a value substantially proportional to the applied voltage.

However, the embodiment is configured to drive liquid crystal element 120 with either of "on" which sets the application voltage to a saturation voltage or more, or "off" which sets the application voltage to a threshold voltage or less. In such a configuration, a gradation is expressed by driving liquid crystal element 120 in a state—on or off while using a sub field as a unit, and controlling a distribution of period to drive the element in a on (or off) state. Here, the sub field is obtained when a field, a unit to express an image is divided into a plurality of sub fields.

Here, when liquid crystal element 120 is driven in an on state, an on voltage of a saturated voltage or more as an absolute value with regard to a voltage L Ccom of opposing electrode 108 is applied to the pixel electrode 118 of liquid crystal element 120 which corresponds to it. The on voltage has two kinds of an on voltage of positive polarity in the higher rank side than a voltage L Ccom and an on voltage of negative polarity in the lower rank side than the voltage L Ccom.

On the other hand, when liquid crystal element 120 is driven in an off state, an on voltage which is reduced to an optical threshold value or less as an absolute value with regard to a voltage L Ccom is applied to the pixel electrode 118 of liquid crystal element 120 which corresponds to it. In the embodiment, as an off voltage, the voltage L Ccom is used for the dual use of the positive polarity and negative polarity.

In the data line driving circuit 40, an on driving is specified by Data Db. And when a positive polarity write is specified, an on voltage of positive polarity is selected as a data signal, an on driving is specified. And when a negative polarity write is specified, an on voltage of negative polarity is selected as a data signal. On the other hand, when an off driving is specified as data Db, the data line driving circuit 40 selects the voltage L Ccom as the data signal regardless of a write polarity specified.

Moreover, without dually using an off voltage as both the positive polarity and negative polarity, it is as a matter of course to divide the off voltage into the off voltage which corresponds to the off driving of positive polarity and the off driving of negative polarity.

For a voltage used as the on voltage, a voltage of approximately 1 to 1.5 times as great as the saturated voltage is used. The reason why is that since a rise in the response characteristic of liquid crystal is substantially proportional to the voltage level which is applied to the liquid crystal element, it is preferable to do so for improving the response characteristic of liquid crystal. In addition, an actual reflectance of liquid crystal element 120 becomes larger in approximately proportion to an accumulated value of a period which is driven in an on state for a response characteristic of liquid crystal 105, but, for a more brief description, in some cases, it can be explained to as proportional to a period driven in an on state.

Figure 3:
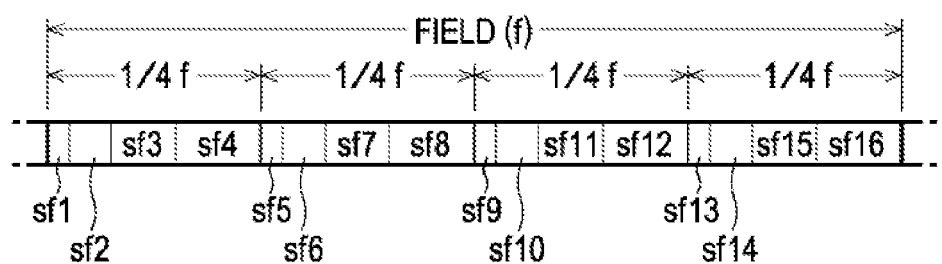
FIG. 3 is a view illustrating a configuration of field of the electro-optic device.

FIG. 3 is a schematic view illustrating a configuration of a field of the embodiment. Field (f) of the figure is referred to as a period necessary for forming the pixel of the amount of one sheet, is synonymous with a frame in an non-interlace scheme, and, when a vertical scanning frequency is 60 Hz, field (f) is constant at 16.7 milliseconds, which is a reciprocal number thereof.

As shown in the FIG. 3, the field of the embodiment is equally divided into 4 groups, and each group is respectively divided into 4 sub fields which are different from each other in terms of weight (time length). Thus, since one field is configured by a total of 16 sub fields, each sub field is referred to as sf1, sf2, sf3, ..., sf16 in order from the beginning of the field for the sake of convenience.

As described above, when the scanning line 112 becomes a H level, an on or off voltage applied to the pixel electrode 118 is maintained regardless of the scanning line 112 becoming to a L level. Accordingly, since the pixel 110 is turned to either of the states of driving on or off only during a period corresponding to a certain sub field, the pixel selects the scanning line. Also period from writing the on or off voltage to the pixel electrode 118 through the data line 114 to selecting the scanning line again may be referred to as a period corresponding to the sub field.

Moreover, for gradation level, the details regarding an assignment such as how to drive sub fields sf1 to sf16 in an on or off driving is omitted, but generally, it has become something as follows: that is, when gradation level is a minimum value, that is, when the pixel that has to be displayed has become to the darkest state, the off driving is assigned to the entire sub fields sf1 to sf16, and gradation level rises, the on driving is assigned to the sub field so that the total length of a period of sub fields becomes gradually longer.

Thus, a content which shows an assignment of the on or off driving is stored in the conversion unit 14. That is, the conversion unit 14 is configured to have a two-dimensional table determining Data Db which shows an on or off driving with regard to, for example, gradation level and sub field number.

However, when sub fields sf1 to sf16 are driven on and off with regard to the entire pixel 110, selection of the entire scanning lines has to be completed within the time of sub field sf1 (sf5, sf9, sf13) of the smallest weight in the sequential driving which selects by one row in turn in the manner of the 1st, the 2nd, the 3 rd, . . . , and the 800th row. Therefore, a shift register of the scanning line driving circuit 20 needs to be operated in a high speed. In other words, in the sequential driving, since it is impossible to reduce a period of the sub field of the smallest weight, as a result, the number of gradation which can be expressed is suppressed.

Therefore, in this embodiment, with regard to the scanning line, the following interlace scanning has been adopted.

Figure 4:
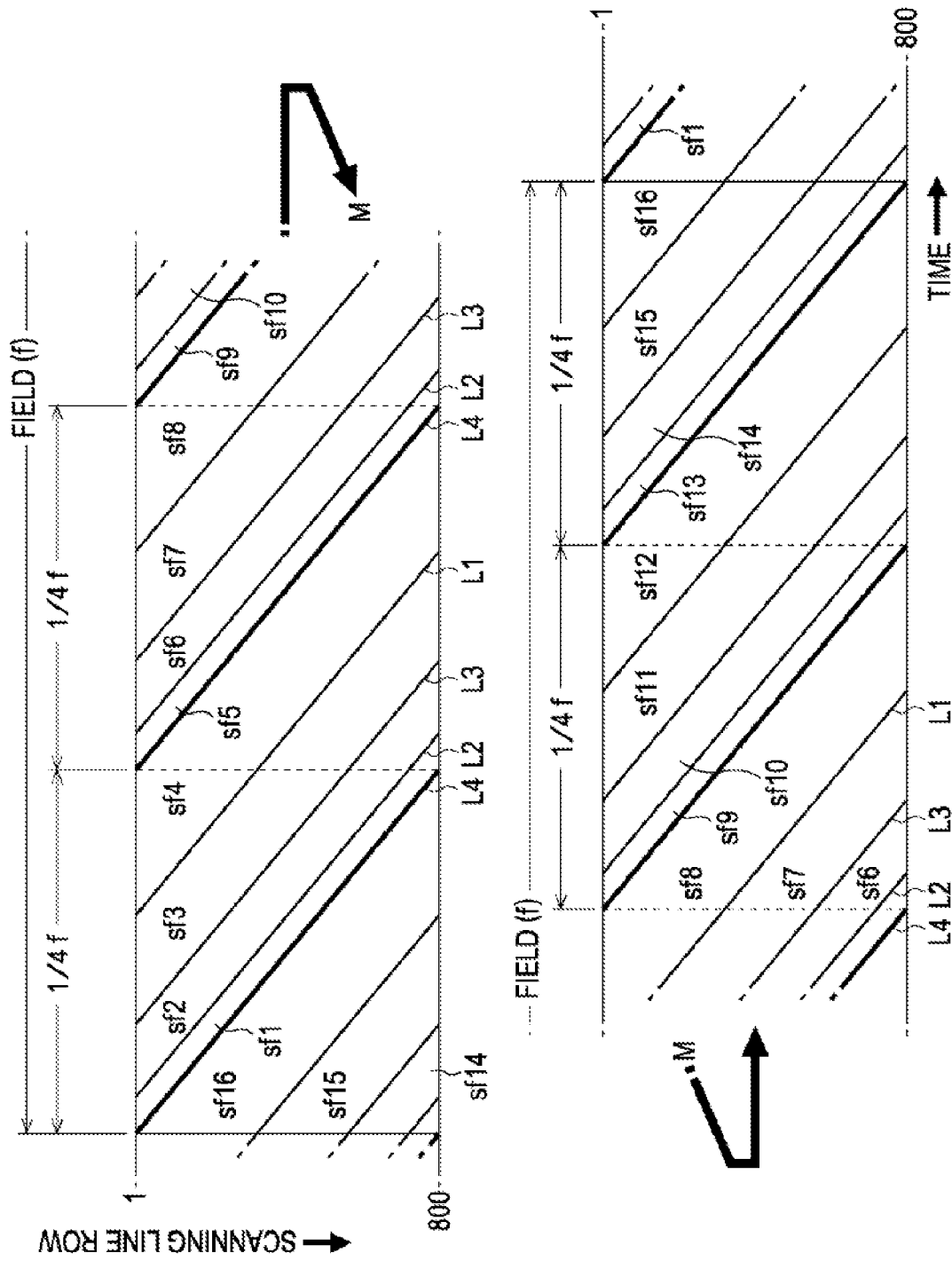
FIG. 4 is a view illustrating a change of scanning of the electro-optic device.

FIG. 4 is a schematic view illustrating a temporal change of the scanning line selected when rows 1 to 800 of the scanning line 112 are assumed as a vertical axis. In addition, when selection timing of the scanning line is shown by dots of black circle shape, the scanning line is scanned in an interlaced manner. Therefore, a temporal change of the scanning line is shown by actual non-continuous dots, but, for a precise notation, the temporal change in the figure is shown by a solid line downward in the right direction.

Therefore, in the case of the figure, 4 lines of the scanning line 112 seem to be selected at the same time, but in actuality it is not simultaneous. As described below, the lines are selected at the different timing.

Figure 5:
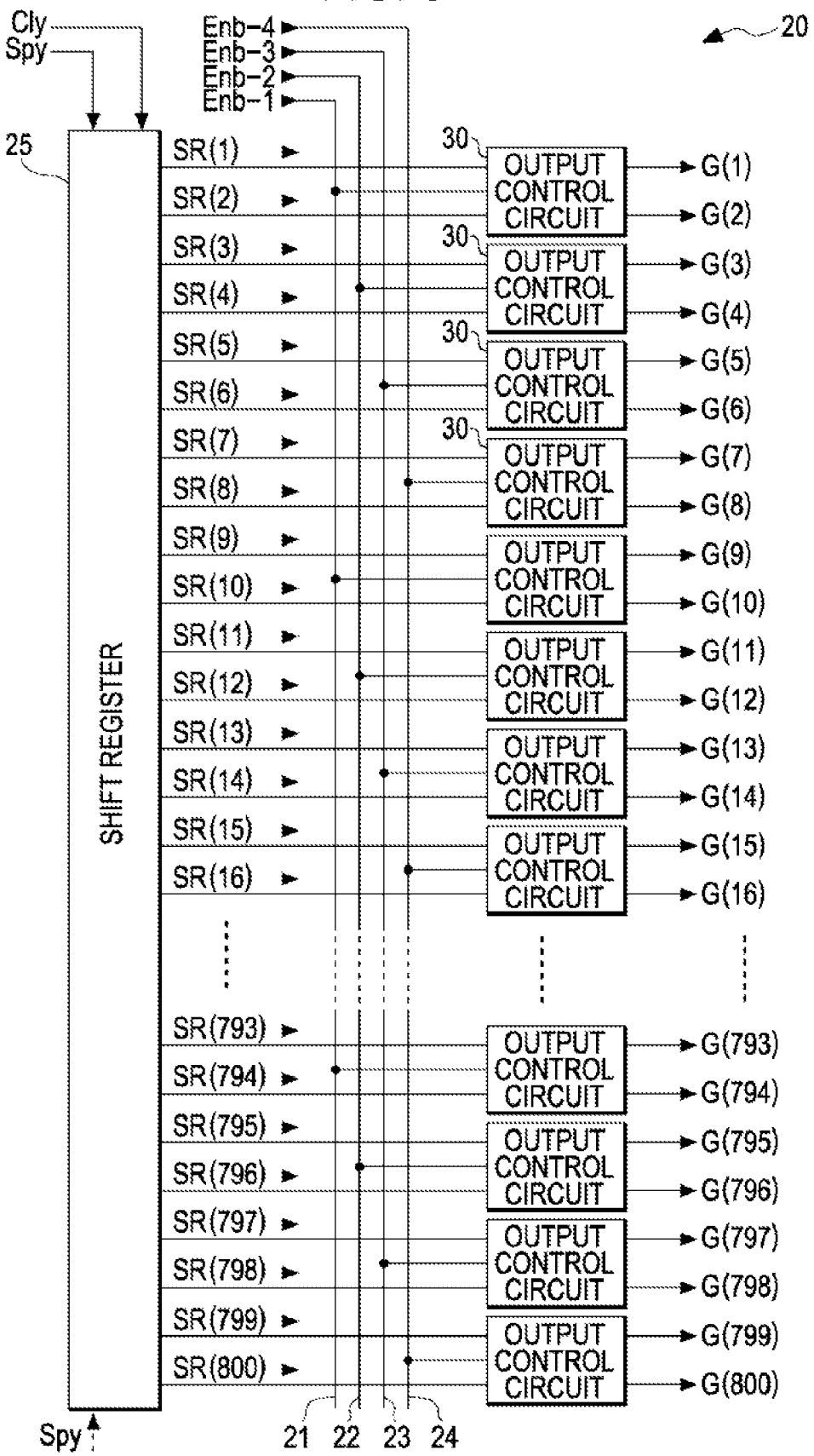
FIG. 5 is a view illustrating a scanning line driving circuit of the electro-optic device.

FIG. 5 is a schematic view illustrating a configuration of the scanning line driving circuit 20 for interlaced scanning in such a manner. As shown in the figure, the scanning line driving circuit 20 includes shift register 25 provided with an output step which corresponds to each of the scanning line 112 and output control circuit 30 provided so as to correspond to two rows of the scanning line 112 in the odd-numbered row and the scanning line 112 in the following even-numbered row of the even-numbered row.

Among these, clock signal Cly having 50% of duty ratio and start pulse Spy having a width equivalent to half a cycle of clock signal Cly are supplied to the shift register 25 from the control circuit 10. Meanwhile, the shift register 25 is provided with the output step which corresponds to the scanning line 112 in the 1st to 800th rows, and causes start pulse Spy to be sequentially delayed by half a cycle of clock signal Cly and outputs the pulse from each output step. In the case of shift register 25, a signal output from the output step which corresponds to the first row is referred to as SR(1), and the signal output from the output step which corresponds to, hereinafter, 2nd, 3rd, 4th, . . . , 799th, and 800th rows respectively is referred to as SR(2), SR(3), SR(4), . . . , SR(799), SR(800) respectively.

Enable signal Enb-1 from the control circuit 10 is transmitted to the scanning line driving circuit 20 through signal line 21. Similarly, enable signals Enb-2, Enb-3, Enb-4 are transmitted to each of the circuits through signal lines 22, 23, 24.

Either of enable signals from the control circuit 10 Enb-1, Enb-2, Enb-3, and Enb-4 is transmitted to output control circuit 30 according to the following rule, with the signal from the output step which corresponds to the 2nd row among the output steps of shift register 25.

Specifically, enable signal Enb-k is transmitted to output control circuit 30 which corresponds to the odd numbered i-th and even numbered (i+1)-th rows when (i+1)/2 is divided by 4, a remainder is supposed as N. Here, for k, if N=0, k=4, and if N≠0, k=N. For example, for output control circuit 30 which corresponds to 7th row and 8th row, since i=7, (i+1)/2=4, and a remainder becomes 0 when divided by 4. Therefore, enable signal Enb-4 is transmitted. In addition, for example, for output control circuit 30 which corresponds to 13th row and 14th row, since i=13, (i+1)/2=7, and a remainder becomes 3 when divided by 4. Therefore, enable signal Enb-3 is transmitted.

When the case of corresponding to the i-th row and (i+1)-th row is assumed, essentially, output control circuit 30 outputs scanning signal G(i) equivalent to a logical product signal of signal SR(i) and enable signal Enb-k, and also outputs scanning signal G(i+1) equivalent to a logical product signal of signal SR(i+1) and enable signal Enb-k.

Figure 6:
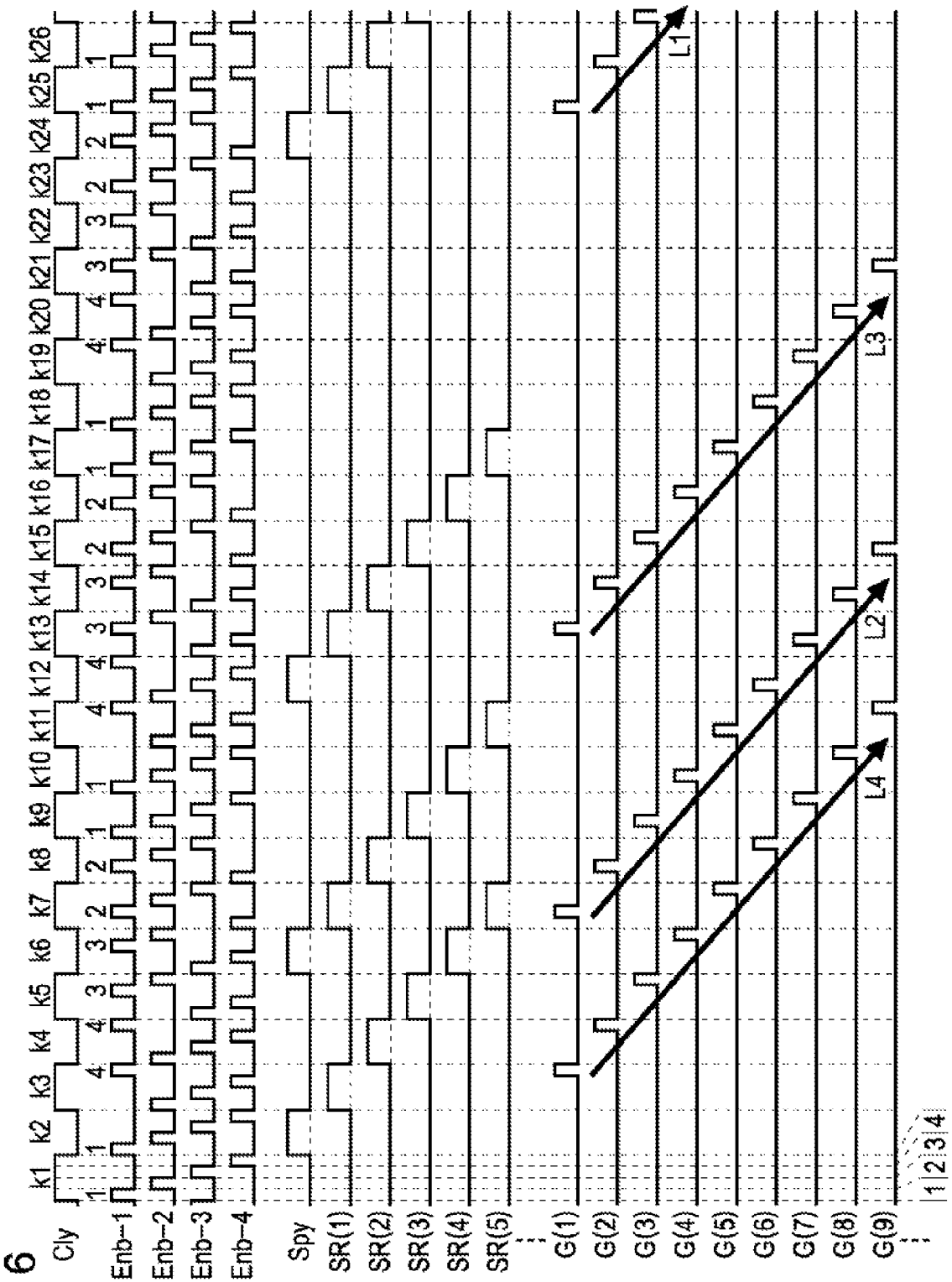
FIG. 6 is a timing chart illustrating an operation of the scanning line driving circuit.

FIG. 6 is a timing chart for illustrating an operation of the scanning line driving circuit 20.

As shown in the figure, enable signals Enb-1 to Enb-4 are synchronously transmitted to the scanning line driving circuit 20 with regard to clock signal Cly.

Each of enable signals Enb-1 to Enb-4 is a pulse which becomes the H level at a period of ¼ or less with regard to half a cycle of clock signal Cly (hereinafter, it will be referred to as "a unit period"), and becomes a H level exclusive to each other when seen in terms of a unit period. Here, when a unit period is divided into 4 parts, and a period corresponding to each part is referred to as addresses 1, 2, 3, or 4 in temporal order, enable signals Enb-1 to Enb-4 become an H level according to the following rule. Specifically, one cycle of enable signal Enb-1 corresponds to 8 unit periods (4 cycles of clock signal Cly), and becomes an H level at addresses 4, 4, 3, 3, 2, 2, 1, 1 across 8 cycles of unit periods. Enable signal Enb-2, Enb-3, and Enb-4 are a waveform that a phase has been sequentially delayed by 90 degrees, that is, by 2 unit periods (one cycle of clock signal Cly).

Moreover, in the figure, for specifying half a cycle of clock signal Cly which is a unit period, signs such as k1, k2, k3, k4, . . . , and the like are assigned.

However, when the control circuit 10 transmitted start pulse Spy at a timing of unit period k2, the start pulse Spy is sequentially shifted by a unit period as shown in the figure due to shift register 25. Thus, SR(1) becomes an H level at unit period k3, signal SR(2), SR(3), SR(4), . . . become an H level in order of the following unit periods k4, k5, k6, . . . . Each of these signals SR(1) to SR(800) becomes to be output as scanning signals G(1) to G(800) respectively.

However, every timing when a logical product of either of enable signal Enb-1 to Enb-4 and signal SR(1) to SR(800) is obtained is address 4. For such a reason, in the case of FIG. 6 and aforementioned FIG. 4, a sign, so called L4 is assigned as a meaning of being selected depending on enable signals Enb-1 to Enb-4 of address 4. A write is performed corresponding to sub field sf1 due to these selections L4.

The control circuit 10 transmits start pulse Spy again at unit period k6 when a period which corresponds to weight of sub field sf1 passed after having transmitted start pulse Spy at timing of unit period k2. The start pulse Spy, similarly, is sequentially shifted by shift register 25. For such a reason, signals SR(1), SR(2), SR(3), . . . become an H level in order at unit periods k7, k8, k9, . . . , and scanning signals G(1) to G(800) become to be output according to calculation equivalent to a logical product of the signals and enable signals corresponding thereto.

Here, a timing when a logical product of either of enable signal Enb-1 to Enb-4 and signal SR(1) to SR(800) is obtained is, for example, address 2 different from above mentioned address 4. For such a reason, in the case of FIG. 6 and aforementioned FIG. 4, a sign, so called L2 is assigned regarding these selections of the scanning signals. And according to these selections L2, a write corresponding to sub field sf2 is executed.

The control circuit 10 transmits start pulse Spy again at unit period k12 when a period which corresponds to weight of sub field sf2 passed from unit period k6. According to it, scanning signals G(1) to G(800) are output. Here, a timing when a logical product of either of enable signal Enb-1 to Enb-4 and signal SR(1) to SR(800) is obtained is, for example, address 3 different from above mentioned addresses 4 and 2. For such a reason, in FIG. 6 and aforementioned FIG. 4, a sign, so called L3 is assigned regarding these selections of scanning signals. And according to these selections L3, a write corresponding to sub field sf3 is executed.

Moreover, since start pulse Spy is transmitted at unit period k24 when a period which corresponds to weight of sub field sf3 passed from unit period k12, according to it, scanning signals G(1) to G(800) are output. Here, as timing when a logical product is obtained, address 1 different from aforementioned addresses 4, 2, and 3 is used. For such a reason, in FIG. 6 and aforementioned FIG. 4, a sign so called L1 is assigned regarding these selections of scanning signals. And according to these selections L1, a write corresponding to sub field sf4 is executed.

Although not shown in FIG. 6, in a timing when a period corresponding to weight of sub field sf4 from unit period k24 passed, and a timing after a write is completed according to selection L1, start pulse Spy is transmitted, and similarly scanning signals G(1) to G(800) are output. At this time, since a use of address 4 due to selection L1 has been completed, address 4 becomes to be used again.

The same operation as group of sub fields sf1 to sf4 is repeatedly performed regarding groups of sub fields sf5 to sf8, sub fields sf9 to sf12, and sub fields sf13 to sf16. And at the next field, a write polarity is replaced and the same write is executed.

Such control circuit 10 controls a write corresponding to each sub field according to a transmission of start pulse Spy and enable signals Enb-1 to Enb-4. For such a reason, the control circuit 10 notifies the number of sub field relating to a write at the time of converting display data Da to data Db, with regard to the conversion unit 14, and, notifies a timing (equivalent to a timing when enable signals Enb-1 to Enb-4 rise) when the scanning line is selected with regard to the data line driving circuit 40.

However, in FIG. 6, for example, at unit period k7, signal SR(1) and signal SR(5) simultaneously become an H level, but are isolated due to the enable signal of a different address. Therefore, scanning signals G(1) and G(5) become an H level, at a different timing, not simultaneously. In such a case, even though, among signals SR(1) to SR(800) due to shift register 25, up to 4 signals simultaneously become an H level in one unit period, the scanning signal which becomes an H level at a different timing due to enable signals Enb-1 to Enb-4 is cut out.

Figure 15:
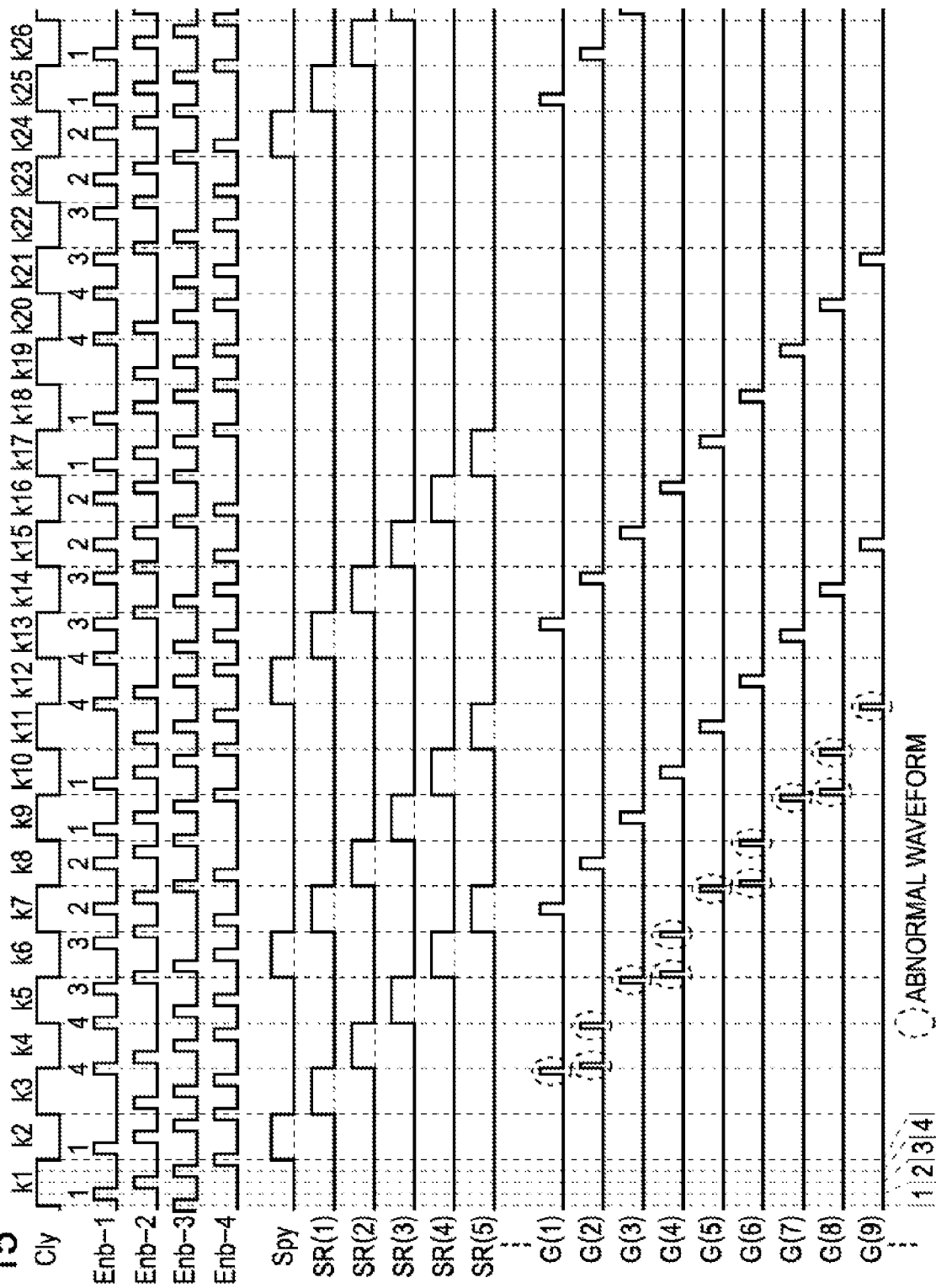
FIG. 15 is a timing chart illustrating a matter in problem according to a comparative example (part 1).

However, in the case of configuration that simply a logical product of either of enable signals Enb-1 to Enb-4 and signals SR(1) to SR(800) is output as scanning signals G(1) to G(800), there is the following problem. That is, when enable signals Enb-1 to Enb-4 with regard to signals SR(1) to SR(800) are delayed due to some reasons, with a configuration (part 1) of simply obtaining a logical product, the period when it becomes the H level is reduced, or the signal has become the H level at the unexpected timing in the case of the scanning signal which used address 4 temporally disposed backwards as shown in FIG. 15.

Figure 16:
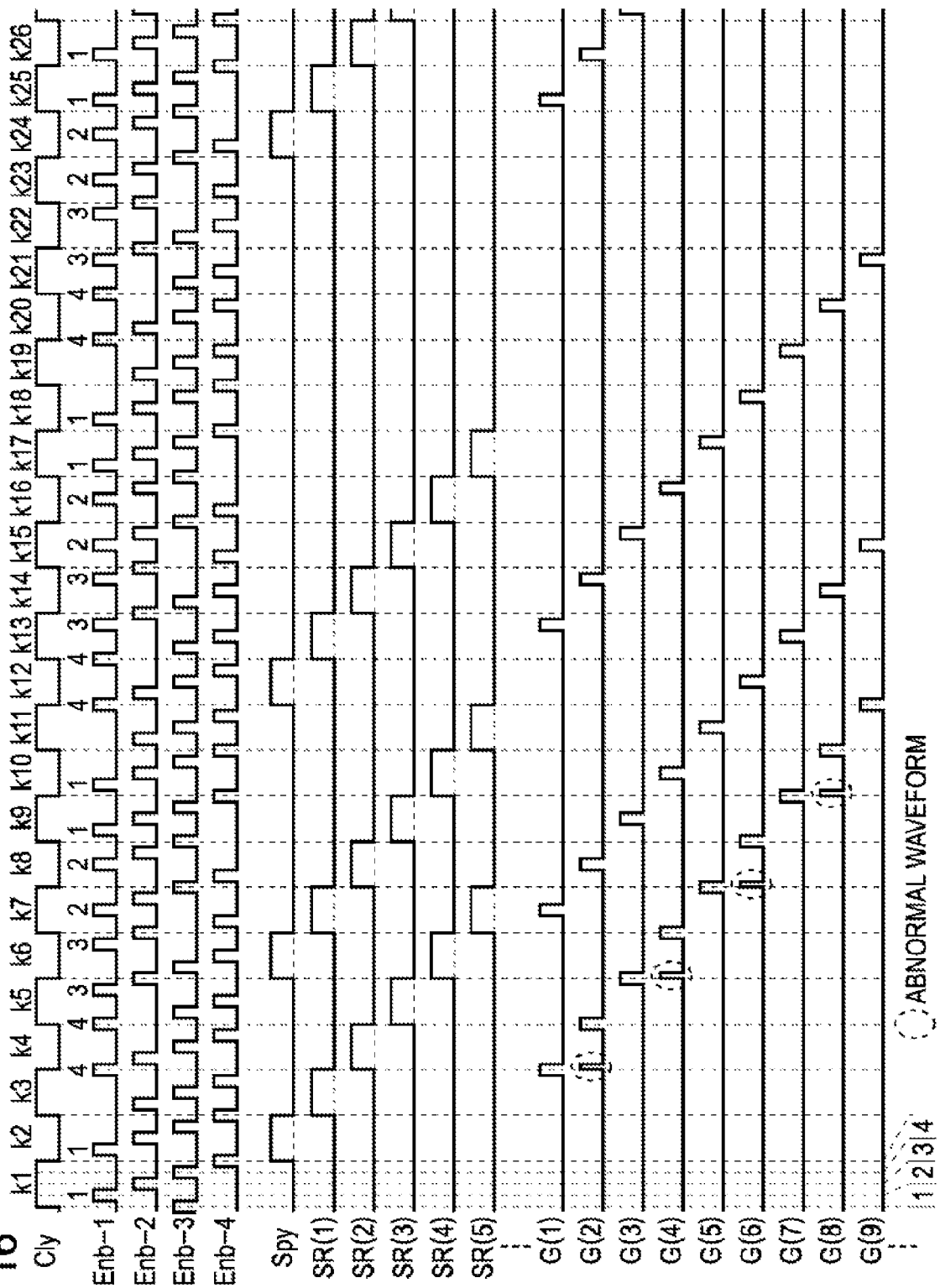
FIG. 16 is a timing chart illustrating a matter in problem according to a comparative example (part 2).

In addition, in a configuration (part 2) that used a technology (for example, see JP-A-2002-328660) which extends to shape a waveform of the enable signal, as shown in FIG. 16, in the case of the scanning line, it is possible to solve the problem that the period of becoming to the H level has become short, but it is still impossible to solve the problem that the signal has become the H level at the unexpected timing.

Now, output control circuit 30 according to the embodiment with a purpose of solving such a problem will be described. Moreover, since any one of output control circuit 30 is the same as other one, typically the one which corresponds to i-th row and (i+1)-th row will be described.

Figure 7:
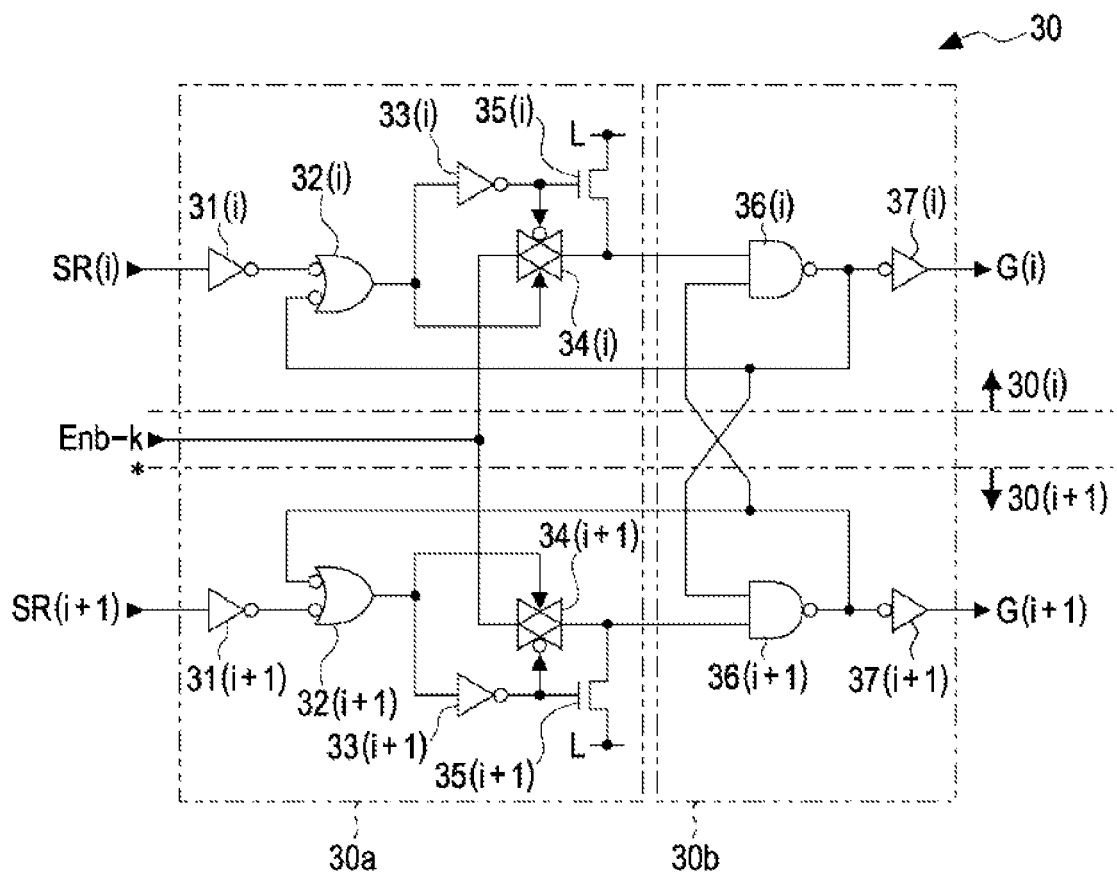
FIG. 7 is a view illustrating an output control circuit of the scanning line driving circuit.

FIG. 7 is a schematic view illustrating a configuration of output control circuit 30. As shown in this figure, output control circuit 30 is provided with unit circuit 30(*i*) corresponding to i-th row and unit circuit 30(*i*+1) corresponding to (i+1)-th row. Unit circuit 30(*i*) corresponding to i-th row includes NOT circuit 31(*i*), 33(*i*), 37(*i*) and NAND circuit 32(*i*), 36(*i*) and transmission gate 34(*i*) and a transistor 35(*i*). Similarly, unit circuit 30(*i*+1) corresponding to (i+1)-th row includes NOT circuit 31(*i*+1), 33(i+1), 37(i+1) and NAND circuit 32(*i*+1), 36(i+1) and transmission gate 34(*i*+1) and a transistor 35(*i*+1).

Moreover, output control circuit 30, when functionally divided, is divided into first circuit 30*a* and second circuit 30*b*.

In unit circuit 30(*i*) corresponding to i-th row, NOT circuit 31(*i*) inverts a logic level of signal SR(i) output from shift register 25 (see FIG. 5), and transmits it to one of two input terminals of NAND circuit 32(*i*). An output signal of NAND circuit 36(*i*) is transmitted to the other of two input terminals of NAND circuit 32(*i*). NAND circuit 32(*i*) transmits non-conjunction signal of signal and the like which is transmitted to each of two input terminals to an input terminal of NOT circuit 33(*i*) and positive control terminal of transmission gate 34(*i*) as a switch respectively.

Moreover, NOT circuit 31(*i*) and NAND circuit 32(*i*) correspond to the first sub circuit, and, NAND circuit 32(*i*) of these corresponds to a logic circuit.

NOT circuit 33(*i*) inverts logic level of a non-conjunction signal due to NAND circuit 32(*i*) again, and transmits it to a gate electrode of the transistor 35(*i*) and a negative control terminal of transmission gate 34(*i*).

Enable signal Enb-k is transmitted to an input terminal of transmission gate 34(*i*). In addition, an output terminal of transmission gate 34(*i*) is connected to one of an input terminal of NAND circuit 36(*i*) and a drain electrode of the transistor 35(*i*) respectively. The transistor 35(*i*) is n channel type, and a source electrode is grounded to the L level.

When a non-conjunction signal due to NAND circuit 32(*i*) becomes the H level, and an output signal of NOT circuit 33(*i*) becomes the L level, transmission gate 34(*i*) becomes an on state. Therefore, as a result, enable signal Enb-k is transmitted to one of an input terminal of NAND circuit 36(*i*).

On the other hand, when a non-conjunction signal due to NAND circuit 32(*i*) becomes the L level (the output signal of NOT circuit 33(*i*) becomes the H level), transmission gate 34(*i*) becomes an off state. Therefore, as a result, a connection between a signal line which transmits enable signal Enb-k and one of the input terminals of NAND circuit 36(*i*) is cut off. However, at this time, since one of two input terminals of NAND circuit 36(*i*) is made pull-down to the L level due to "on" of the transistor 35(*i*), a floating state doesn't occur.

An output signal of NAND circuit 36(*i*+1) is transmitted to the other of two input terminals of NAND circuit 36(*i*). NAND circuit 36(*i*) as a second sub circuit transmits non-conjunction signal of signal and the like which is transmitted to each of two input terminals to an input terminal of NOT circuit 37(i), the other of an input terminal of NAND circuit 32(i), the other of an input terminal of NAND circuit 36(i+1) corresponding to (i+1)-th row respectively.

NOT circuit 37(i) inverts a logic level of a non-conjunction signal due to NAND circuit 36(i) again, and outputs as scanning signal G(i).

Moreover, as shown in figure, when seen from the transmission course of enable signal Enb-k, since unit circuit 30(i+1) corresponding to (i+1)-th row has a symmetric relation with unit circuit 30(i), description will be omitted.

The reason why a problem occurs in the scanning line driving circuit 20 is that enable signals Enb-1 to Enb-4 are delayed with regard to a signal output from shift register 25 as described above. Therefore, in the case of output control circuit 30, an operation of the case where enable signal Enb-k is delayed with regard to signals SR(i), SR(i+1) is described beforehand, and an operation of the case where enable signal Enb-k is not delayed will be described later.

Figure 8A:
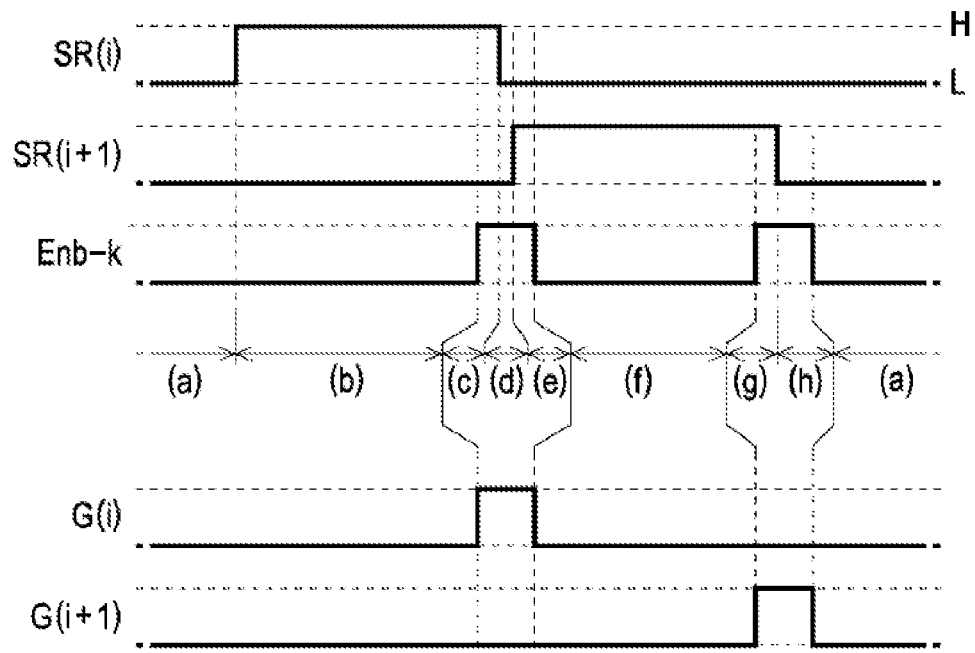
FIGS. 8A and 8B are timing charts illustrating an operation of the output control circuit.

FIG. 8A is a waveform diagram illustrating the case where enable signal Enb-k is delayed with regard to signals SR(i) and SR(i+1). In such a case, a combination of logic levels of signals SR(i), SR(i+1), and enable signal Enb-k is assumed to be made in the following 8 ways in a temporal order.

That is, first, a period(a) in which all signals SR(i), SR(i+1), and enable signal Enb-k become the H level, second, a period(b) in which signal SR(i) becomes the H level, and signal SR(i+1) and enable signal Enb-k become the L level, third, a period(c) in which signal SR(i) becomes the H level, signal SR(i+1) becomes the L level, and enable signal Enb-k becomes the H level, fourth, a period(d) in which signal SR(i) becomes the L level, signal SR(i+1) becomes the L level, and enable signal Enb-k becomes the H level, fifth, a period(e) in which signal SR(i) becomes the L level, signal SR(i+1) becomes the H level, and enable signal Enb-k becomes the H level, sixth, a period(f) in which signal SR(i) becomes the L level, signal SR(i+1) becomes the H level, and enable signal Enb-k becomes the L level, seventh, a period(g) in which signal SR(i) becomes the L level, signal SR(i+1) becomes the H level, and enable signal Enb-k becomes the H level, eighth, a period(h) in which signal SR(i) becomes the L level, signal SR(i+1) becomes the L level, and enable signal Enb-k becomes the H level, 8 ways in total are assumed.

Therefore, below, regarding the operation of the case where enable signal Enb-k is delayed with regard to signals SR(i) and SR(i+1), description will be made according to a period divided into from period(a) to period(h).

FIGS. 9A to 9D are a schematic view for describing an operation of output control circuit 30 from period(a) to period (h) of the same output control circuit. In addition, in such figures, the H level is shown as the bold line, and the L level is shown as the thin line respectively.

Since, at period(a), signal SR(i) is the L level, one of the input terminals of NAND circuit 32(i) becomes the H level. Since the other of the input terminal of NAND circuit 32(i) becomes the H level as described below, a non-conjunction signal of NAND circuit 32(i) becomes the L level. As a result, transmission gate 34(i) becomes an off state, while the transistor 35(i) becomes an on state. For such a reason, one of the input terminals of NAND circuit 36(i) is made pull-down to the L level. Therefore, a non-conjunction signal of NAND circuit 36(i) becomes the H level regardless of the other of the input terminal. Accordingly, scanning signal G(i) becomes the L level, and the other of the input terminal of NAND circuit 32(i) becomes the H level as described above.

Also similarly in (i+1)-th row, since signal SR(i+1) is the L level, one of the input terminal of NAND circuit 32(i+1) becomes the H level, and since the other of the input terminal also is the H level, one of the input terminal of NAND circuit 36(i+1) is made pull-down to the L level. For such a reason, a non-conjunction signal of NAND circuit 36(i+1) becomes the H level. As a result, the input terminal of scanning signal G(i+1) becomes the L level, and the other of the input terminal of NAND circuit 32(i+1) becomes the H level.

Since, at period(b), signal SR(i) becomes the H level compared to period(a), one of the input terminal of NAND circuit 32(i) becomes the L level. For such a reason, since a non-conjunction signal of NAND circuit 32(i) becomes the H level, transmission gate 34(i) becomes an on state, and the transistor 35(i) becomes an off state. However, since enable signal Enb-k becomes the L level, a non-conjunction signal of NAND circuit 36(i) maintains the H level. Therefore, scanning signal G(i) maintains the L level.

Thus, since (i+1)-th row becomes similar to the case of the period(a), the scanning signal G(i+1) maintains the L level.

At period(c), enable signal Enb-k becomes the H level compared to period(b). The enable signal Enb-k is transmitted to one of the input terminal in NAND circuit 36(i) through transmission gate 34(i) at the on state. Since the other of the input terminal in NAND circuit 36(i) is the H level, a non-conjunction signal of NAND circuit 36(i) becomes the L level. As a result, scanning signal G(i) becomes the H level, and both the other of the input terminal in NAND circuit 32(i) and the other of the input terminal in NAND circuit 36(i+1) become the L level.

In (i+1)-th row, the other of the input terminal in NAND circuit 36(i+1) becomes the L level, but since one of the input terminal is already at the L level, the non-conjunction signal of NAND circuit 36(i+1) is not affected. To begin with, when scanning signal G(i) is at the H level (when a non-conjunction signal of NAND circuit 36(i) is at the L level), the non-conjunction signal becomes the H level regardless of the logic level of one of the input terminal in NAND circuit 36(i+1), and so scanning signal G(i+1) maintains the L level.

Since, at period(d), signal SR(i) becomes the L level compared to period(c), one of the input terminal of NAND circuit 32(i) becomes the H level. However, since the other of the input terminal in NAND circuit 32(i) is already at the L level, the non-conjunction signal which is an output maintains the H level. For such a reason, since transmission gate 34(i) maintains the on state, enable signal Enb-k at the H level is transmitted to one of the input terminal in NAND circuit 36(i) through transmission gate 34(i) of the on state, and, thereafter, such a state is maintained. On the other hand, since the other of the input terminal in NAND circuit 36(i) also does not change from period(c) which is at the H level, scanning signal G(i) becomes to maintain the H level.

In the case of (i+1)-th row, also no change occurs from period(c), and so scanning signal G(i+1) becomes to maintain the L level.

At period(e), signal SR(i+1) becomes the H level compared to period(d). For such a reason, in the case of (i+1)-th row, since one of the input terminal in NAND circuit 32(i+1) becomes the L level, the non-conjunction signal becomes the H level. Therefore, since transmission gate 34(i+1) becomes the on state, enable signal Enb-k at the H level is transmitted to one of the input terminal in NAND circuit 36(i+1).

However, in the case of i-th row, no change occurs from period(d), and so scanning signal G(i) maintains the H level. Therefore, the other of the input terminal in NAND circuit 36(i+1) maintains the L level, and as a result, scanning signal G(i+1) does not change from the L level.

At period(f), enable signal Enb-k becomes the L level compared to period(e). Since enable signal Enb-k at the L level is transmitted to one of the input terminal in NAND circuit 36(i) through transmission gate 34(i) of the on state, the non-conjunction signal in the corresponding NAND circuit 36(i) becomes the H level. Accordingly, since the other of the input terminal in NAND circuit 32(i) becomes the H level, the non-conjunction signal in the corresponding NAND circuit 32(i) becomes the L level. As a result, transmission gate 34(i) becomes the off state, while the transistor 35(i) becomes the on state. For such a reason, one of the input terminals in NAND circuit 36(i) is made pull-down to the L level, the non-conjunction signal in the corresponding NAND circuit 36(i) never fails to be at the H level even though transmission gate 34(i) is changed from the on state to the off state.

Accordingly, scanning signal G(i) becomes the L level, and both the other of the input terminal in NAND circuit 32(i) and the other of the input terminal in NAND circuit 36(i+1) become the H level.

On the other hand, similarly in the case of (i+1)-th row, since enable signal Enb-k at the L level is transmitted to one of the input terminal in NAND circuit 36(i+1) through transmission gate 34(i+1) at the on state, the non-conjunction signal due to the corresponding NAND circuit 36(i+1) becomes the H level regardless of the other of the input terminal.

Moreover, enable signal Enb-k at the L level is transmitted to one of the input terminal in NAND circuit 36(i) through transmission gate 34(i) at the on state. According to that, the other of the input terminal in NAND circuit 36(i+1) becomes the H level. For such a reason, in the case of one and the other of the input terminal in NAND circuit 36(i+1), the relation of logical level is replaced compared to period(e), but there is no change in that the non-conjunction signal in the corresponding NAND circuit 36(i+1) is the H level.

Accordingly, scanning signal G(i+1) becomes to maintain the L level.

At period(g), enable signal Enb-k becomes the H level compared to period(f). Enable signal Enb-k at the H level is transmitted to the input terminal in transmission gate 34(i), but since the non-conjunction signal due to NAND circuit 32(i) is at the L level, transmission gate 34(i) is at the off state, and the transistor 35(i) does not change from the on state. For such a reason, one of the input terminals in NAND circuit 36(i) is made pull-down to the L level, and such a state is maintained. As a result, the non-conjunction signal at the H level due to the corresponding NAND circuit 36(i) is not affected.

On the other hand, enable signal Enb-k at the H level is transmitted to one of the input terminal in NAND circuit 32(i+1) through transmission gate 34(i+1) at the on state. The non-conjunction signal at the H level due to NAND circuit 36(i) is transmitted to the other of the input terminal in NAND circuit 32(i+1). For such a reason, since the non-conjunction signal due to NAND circuit 32(i+1) becomes the L level, scanning signal G(i+1) becomes the H level.

Since, at period(h), signal SR(i+1) becomes the L level compared to period(g), one of the input terminal in NAND circuit 32(i+1) becomes the H level. However, since the other of the input terminal in NAND circuit 32(i+1) are already the L level, the non-conjunction signal which is the output maintains the H level. For such a reason, since transmission gate 34(i+1) maintains the on state, enable signal Enb-k at the H level is transmitted to one of the input terminal in NAND circuit 36(i+1) through the transmission gate 34(i+1), and as a result, such a state is maintained. On the other hand, since the other of the input terminal in NAND circuit 36(i+1) also does not change from period(g) which is at the H level, scanning signal G(i+1) becomes to maintain the H level.

Similarly in the case of i-th row, since no change occurs from period(g), scanning signal G(i) becomes to maintain the L level.

After period(h), enable signal Enb-k becomes the L level as well as signals SR(i) and SR(i+1). The operation at this time is the same as that of period(a) described above, and so description is omitted.

In such output control circuit 30, as shown in FIG. 8A, even though enable signal Enb-k is delayed with regard to signals SR(i) and SR(i+1), it is possible to ensure a share of pulse width of enable signal Enb-k at scanning signals G(i) and G(i+1).

In addition, at period in which scanning signal G(i) becomes the active H level, that is, at period in which the non-conjunction signal in NAND circuit 36(i) becomes the active L level, the non-conjunction signal of NAND circuit 36(i+1) which shares enable signal Enb-k is forced to be at the non-active H level, and scanning signal G(i+1) is set to the L level. On the contrary, at period (period in which the non-conjunction signal of NSND circuit 36(i+1) becomes the L level) in which scanning signal G(i+1) becomes the H level, the non-conjunction signal of NAND circuit 36(i) is forced to be at the H level, and scanning signal G(i) is set to the L level. For such a reason, although enable signal Enb-k is delayed with regard to SR(i) and SR(i+1), it is possible to prevent scanning signal G(i) and G(i+1) which share enable signal Enb-k from becoming to the active H level at the same time.

Here, output control circuit 30 which corresponds to i-th and (i+1)-th rows as a representative is described, but at output control circuit 30 which corresponds to 1st, 2nd, 3rd and 4th, 5th and 6th, . . . , 799th and 800th rows, the same operation is executed.

Figure 10:
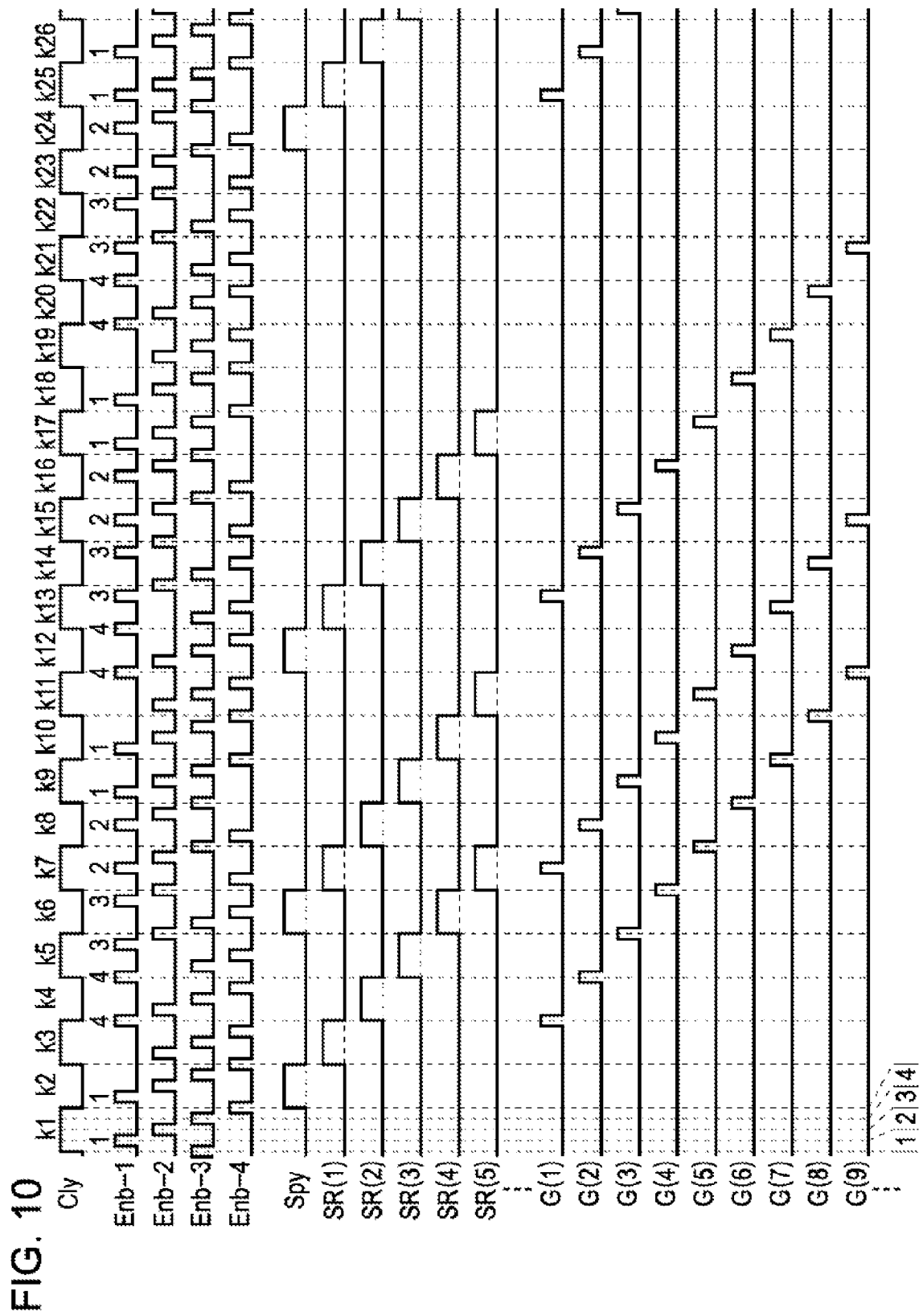
FIG. 10 is a timing chart illustrating an operation of the scanning line driving circuit.

Accordingly, as shown in FIG. 10, in the embodiment, even if enable signals Enb-1 to Enb-4 are delayed with regard to signals SR(1), SR(2), SR(3), . . . , period in which scanning signals G(1), G(2), G(3), . . . , become the active H level can be referred to as the pulse width of enable signals Enb-1 to Enb-4, and therewith, the state of overlapping each other and becoming to the active level can be avoided.

In addition, in the prior art in which a logical product signal of signal SR(i) and enable signal Enb-k is used for scanning signal G(i), and a logical product signal of signal SR(i+1) and enable signal Enb-k is used for scanning signal G(i+1), enable signal Enb-1 to Enb-4 is input to a gate electrode of a transistor which forms a logical circuit. For such a reason, in each signal line which transmits enable signals Enb-1 to Enb-4 from the control circuit 10, a comparatively large capacity is hosted respectively.

In contrast, since, in output control circuit 30 according to the embodiment, the input terminal of the transmission gate inputs enable signals Enb-1 to Enb-4, a capacity hosted in signal lines 21 to 24 which transmit enable signals Enb-1 to Enb-4 may be suppressed. Thus, it can be said that the embodiment is more suitable for high-speed driving.

In addition, here, with regard to the signals SR(i) and SR(i+1), the operation of the case in which enable signal Enb-k is delayed will be described, but the operation of the case in which enable signal Enb-k is not delayed will be described affirmatively as well.

Figure 8B:
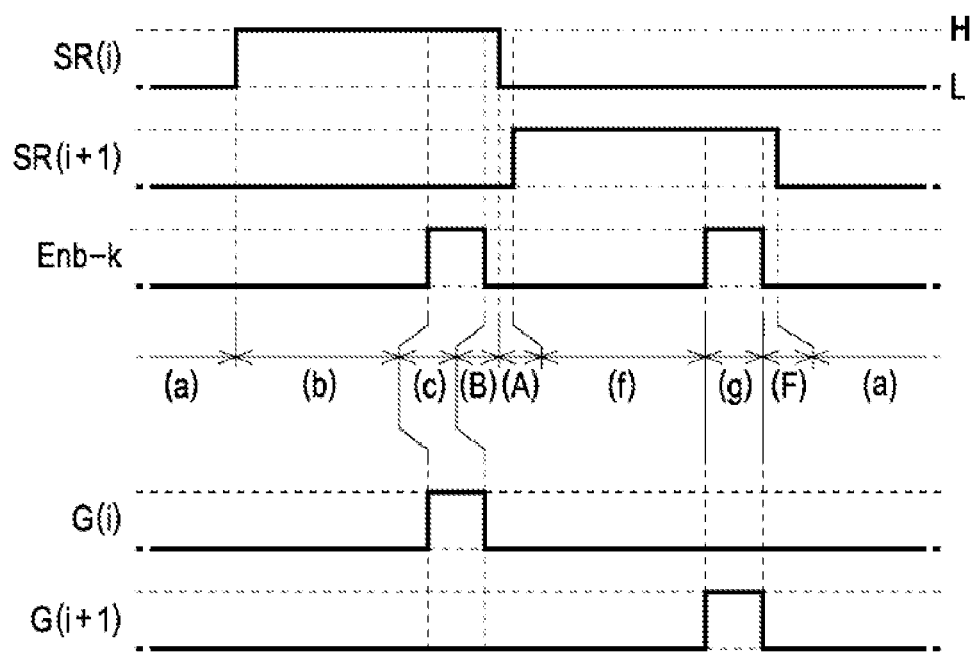
Figure 9A:
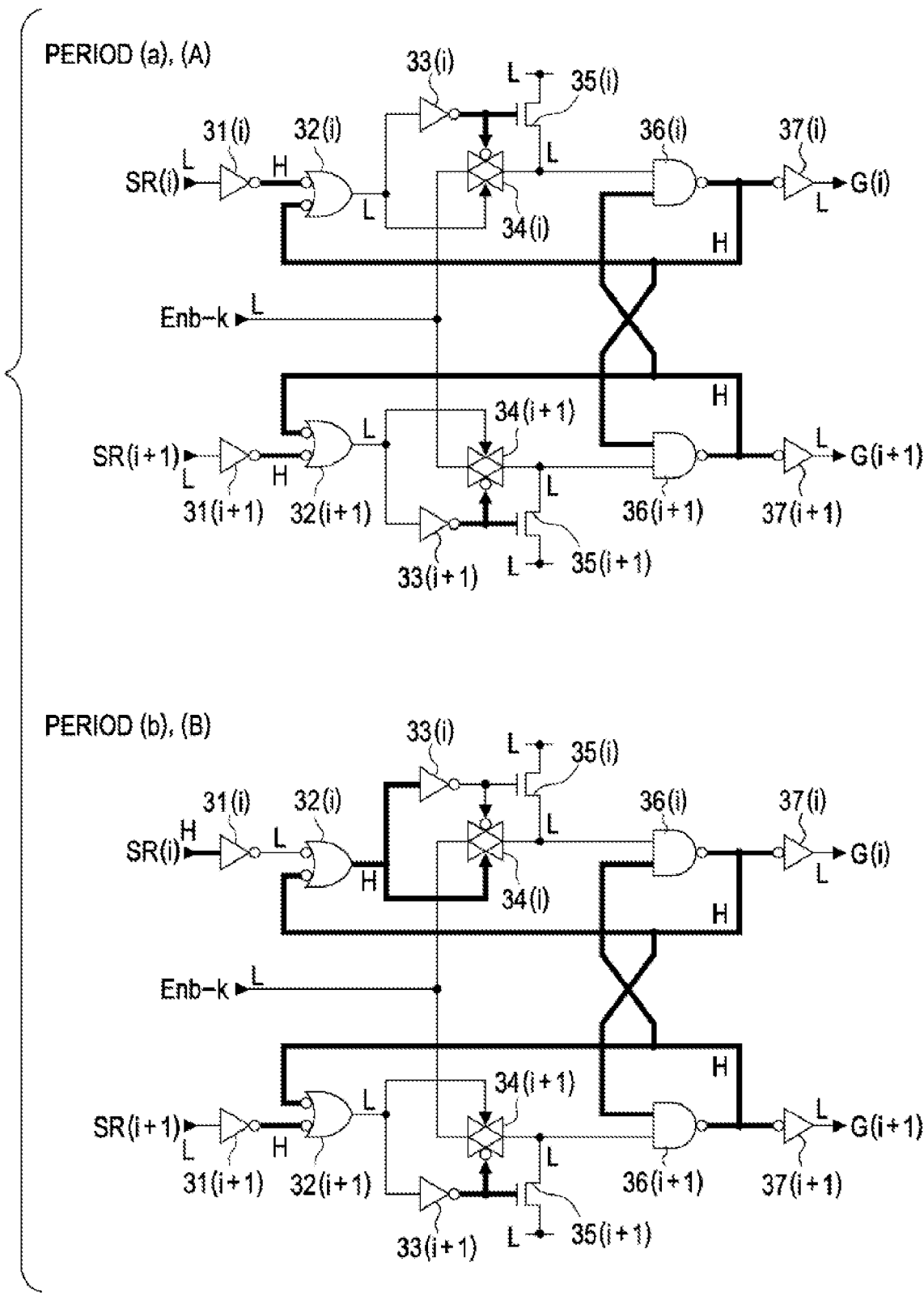
FIG. 9A is a view describing an operation of the output control circuit.
Figure 9B:
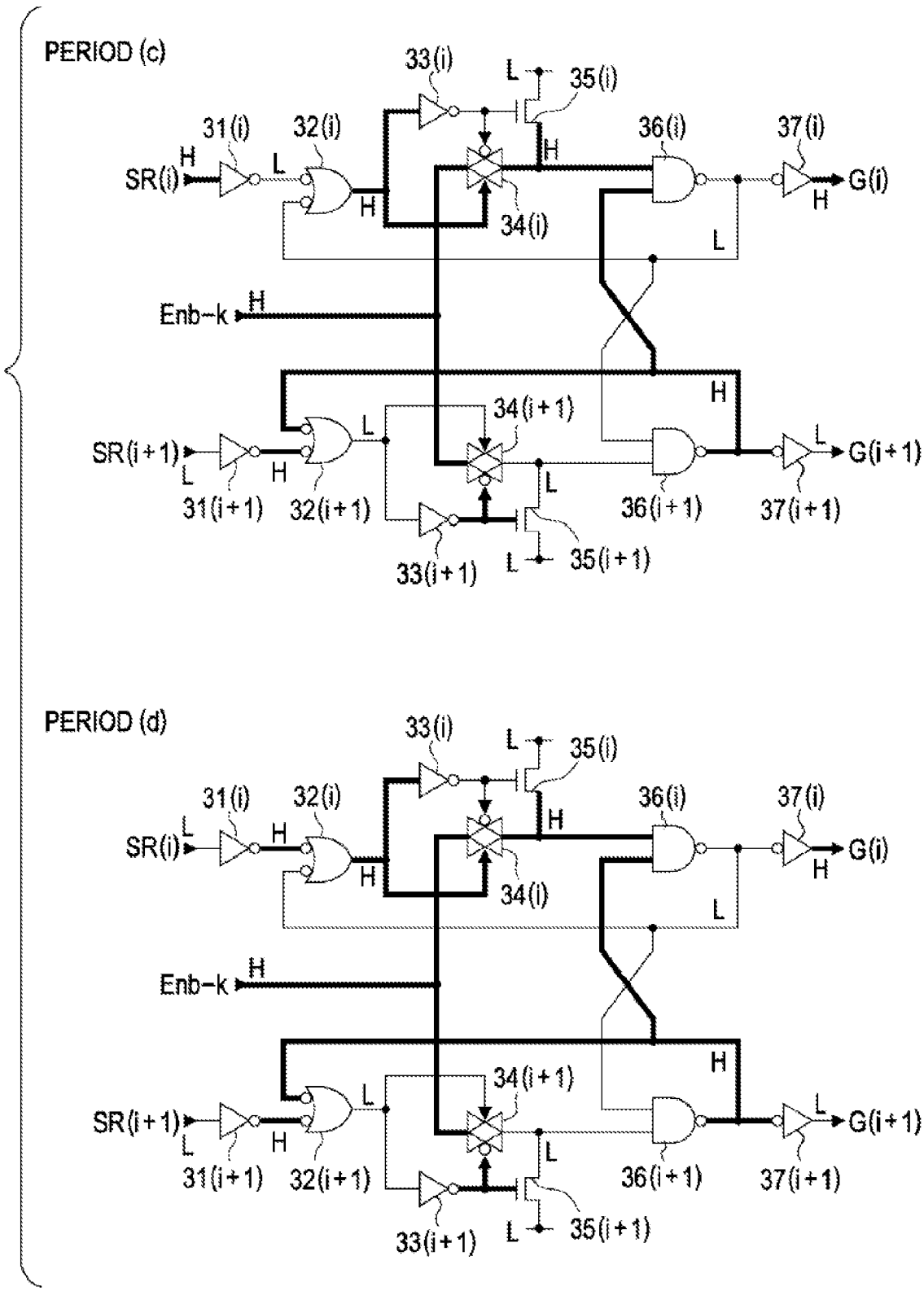
FIG. 9B is a view describing an operation of the output control circuit.
Figure 9C:
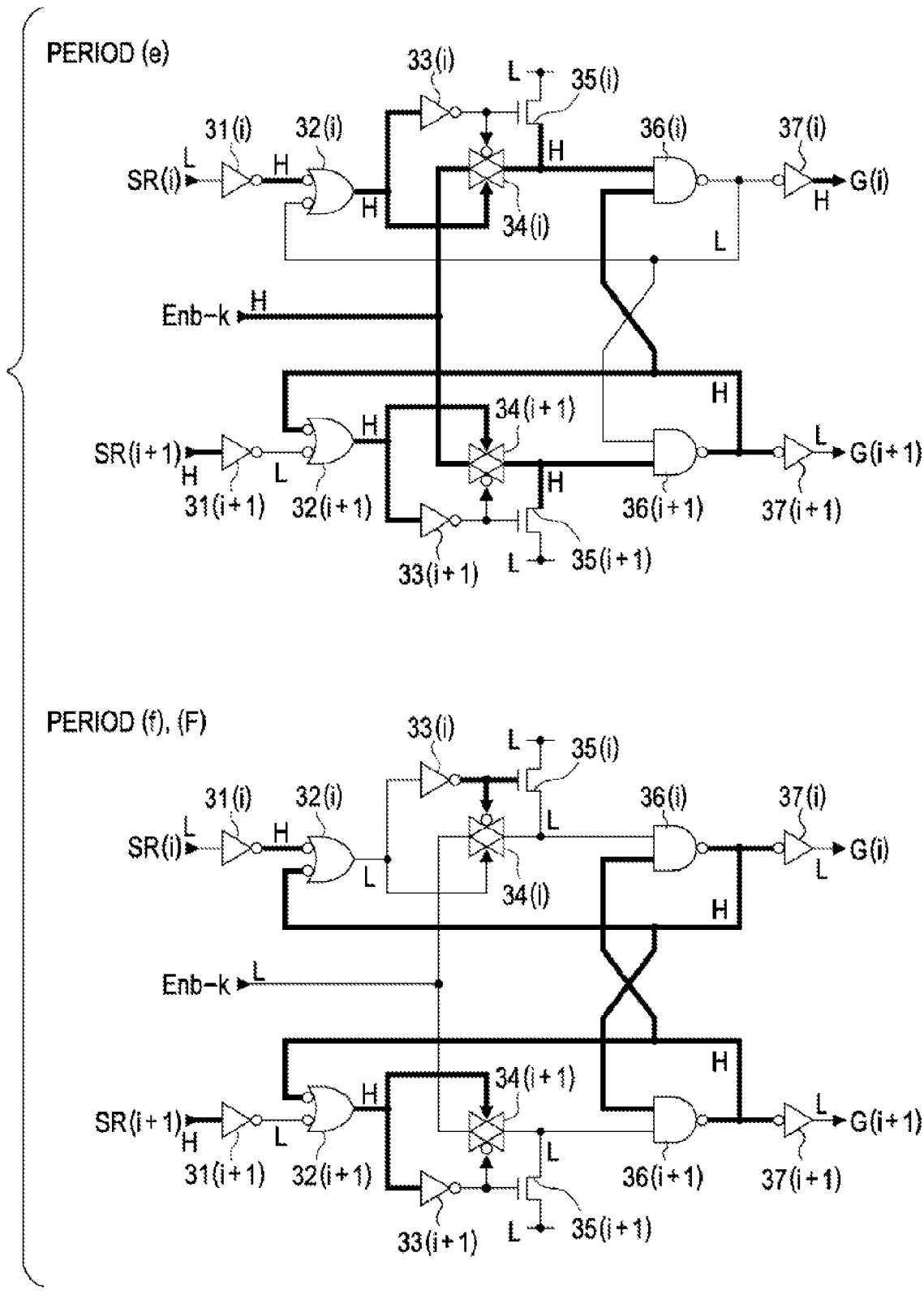
FIG. 9C is a view describing an operation of the output control circuit.
Figure 9D:
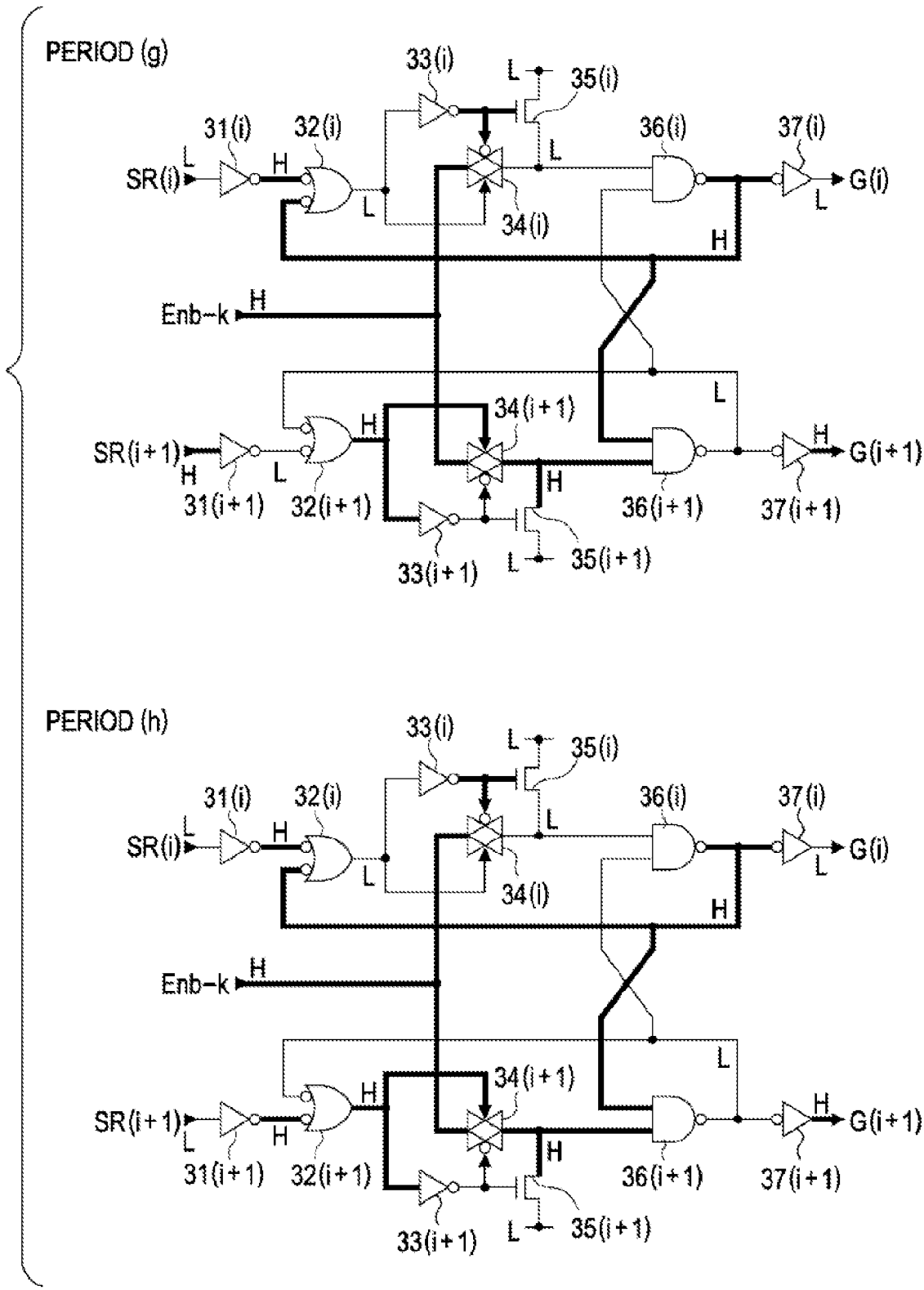
FIG. 9D is a view describing an operation of the output control circuit.

FIG. 8B is a waveform diagram of the case in which enable signal Enb-k is not delayed with regard to signals SR(i) and SR(i+1). In such a case, the following 8 ways are assumed in a temporal order as a combination of logic levels in signals SR(i), SR(i+1) and enable signal Enb-k.

That is, the followings are assumed: first, the period(a), second, the period(b), third, the period(c), and fourth, a period)(B) in which enable signal Enb-k becomes the L level when signal SR(i) is at the H level, and signal SR(i+1) is at the L level, fifth, a period(A) in which signals all of SR(i), SR(i+1) and enable signal Enb-k become the L level, sixth, the period(f), seventh, the period(g), and, eighth, a period)(F) in which enable signal Enb-k becomes the L level when signal SR(i) is at the L level, and signal SR(i+1) is at the H level are assumed. Among them, the period (B) is the same as the period(b), the period(A) is the same as the period(a), and the period(F) is the same as the period(f).

For such a reason, in the case in which enable signal Enb-k is not delayed with regard to signals SR(i) and SR(i+1), a waveform is formed so as to be completely identical with the prior configuration in which scanning signal G(i) is used for the logical signal of signal SR(i) and enable signal Enb-k, and scanning signal G(i+1) is used for the logical signal of signal SR(i+1) and enable signal Enb-k.

Here, in FIG. 1, the display circuit 100 has been described by using as an example the case of scanning vertically to the lower direction from top, but, conversely, there is also a case of scanning vertically to the upper direction from the bottom depending on the usage of electronic apparatuses which apply the display circuit 100. For example, there is a case of an application to a vari-angle type liquid crystal monitor in a video camera or electronic still camera or the like, or a case of an application to a light bulb of a projector in which installations under a ceiling and on the ground are possibly switched to each other.

In such a case, shift register 25 assumes a so-called interactive transmission type, and start pulse Spy is transmitted to the upper direction from the bottom, and therewith, it is desirable that enable signals Enb-1 to Enb-4 are changed in the order and transmitted.

Figure 11:
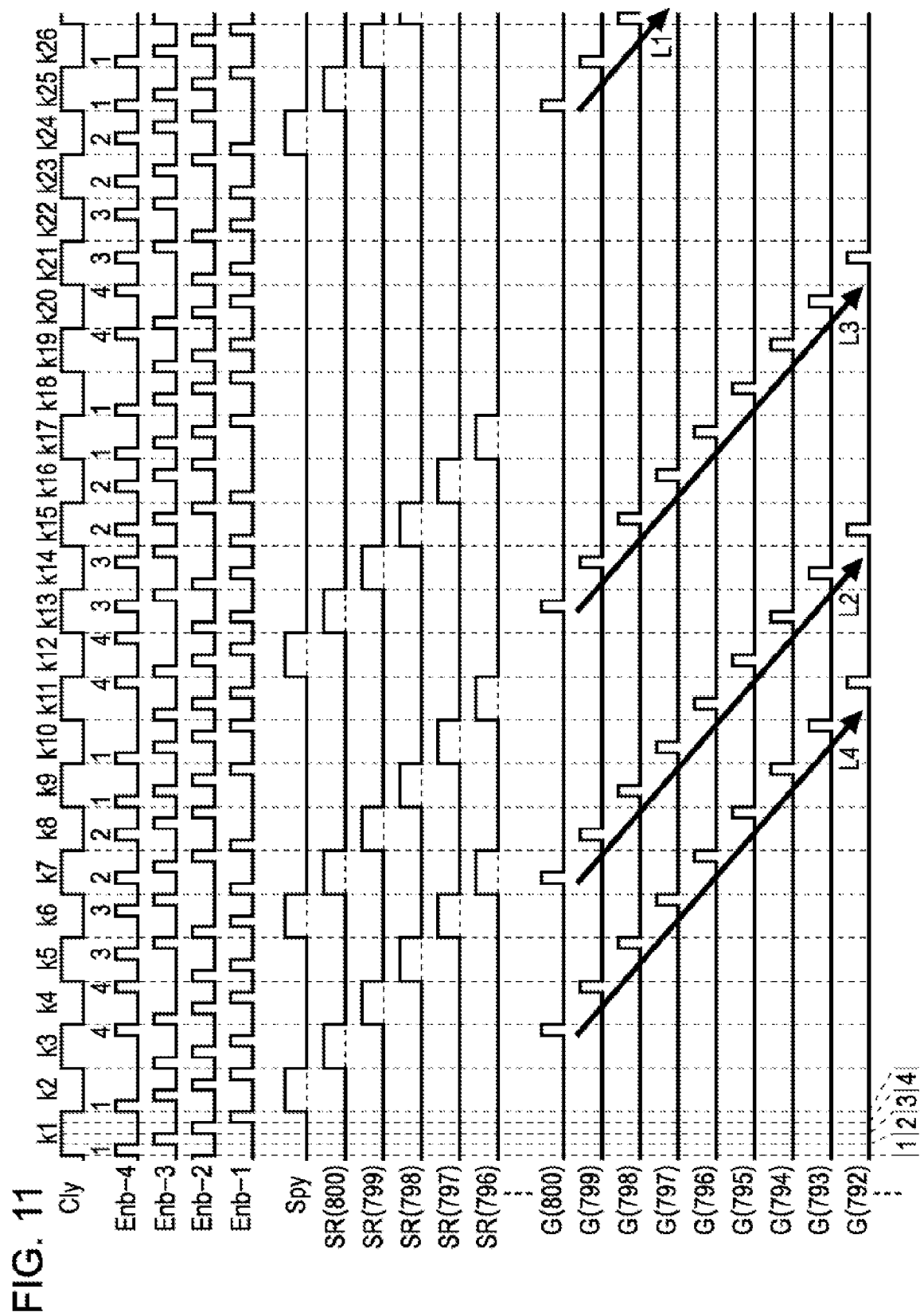
FIG. 11 is a timing chart illustrating an operation of the scanning line driving circuit according to an application example.

Specifically, as shown in FIG. 11, in the order of signals SR(800), SR(799), SR(798), SR(797), . . . , SR(2), and SR(1), the signals become the H level, and therewith, it is desirable that enable signals Enb-4 to Enb-1 are transmitted to signal lines 21 to 24. According to this, in the case of output control circuit 30 which corresponds to i-th and (i+1)-th rows respectively, an operation that corresponds from i-th row to (i+1)-th row becomes an operation that corresponds from (i+1)-th row to i-th row conversely. For such a reason, a waveform of scanning signals G (800) to G (1) turns the same as is shown in FIG. 11.

The invention is not limited to the embodiments described above, and for example, various modifications may be made such as described below. In addition, the embodiment which will be described below may be acquired by selecting it arbitrarily or combining the plurality adequately.

Figure 12:
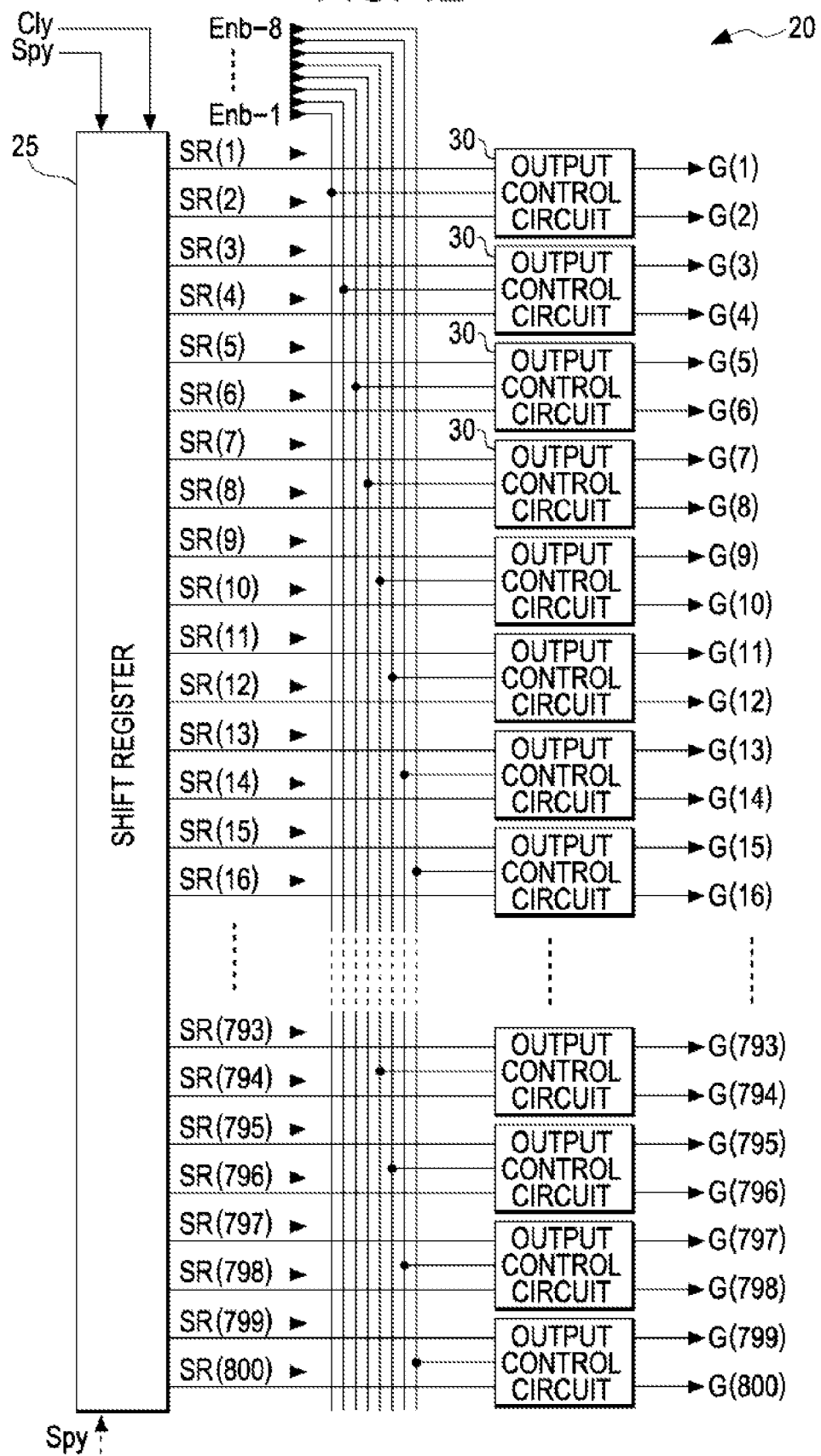
FIG. 12 is a view illustrating another configuration of a scanning line driving circuit.

In the embodiment, 4 systems of enable signals Enb-1 to Enb-4 are used, but it is desirable that the number of systems are greater than or equal to "2". FIG. 12 is an example in which 8 systems of enable signals Enb-1 to Enb-8 are used. Moreover, in the case in which 8 systems of enable signals Enb-1 to Enb-8 are used, a rule showing how a cycle and a unit period of the enable signal become the H level and a rule showing which output control circuit the enable signal is transmitted to are easily known by the analogy from the case of 4 systems described above.

In the embodiment, since the transistor 116 in the pixel 110 is formed of n channel type, the H level of scanning signal is an active level which causes the transistor 116 to become an on state, and the L level is an non-active level which causes the transistor 116 to become an off state.

Without being limited to it, the transistor 116 may assume p channel type. In the case of the transistor 116 of p channel type, the L level of scanning signal becomes the active level, and the H level becomes the non-active level.

Next, electronic apparatuses in which the aforementioned electro-optic device 1 is applied will be described.

Figure 13:
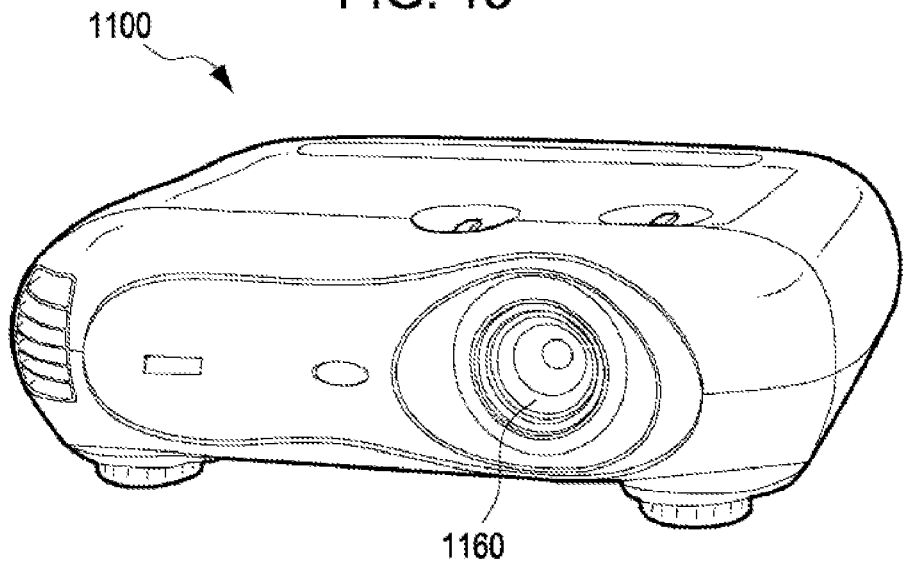
FIG. 13 is a view illustrating a projector as an application example of the electro-optic device.
Figure 14:
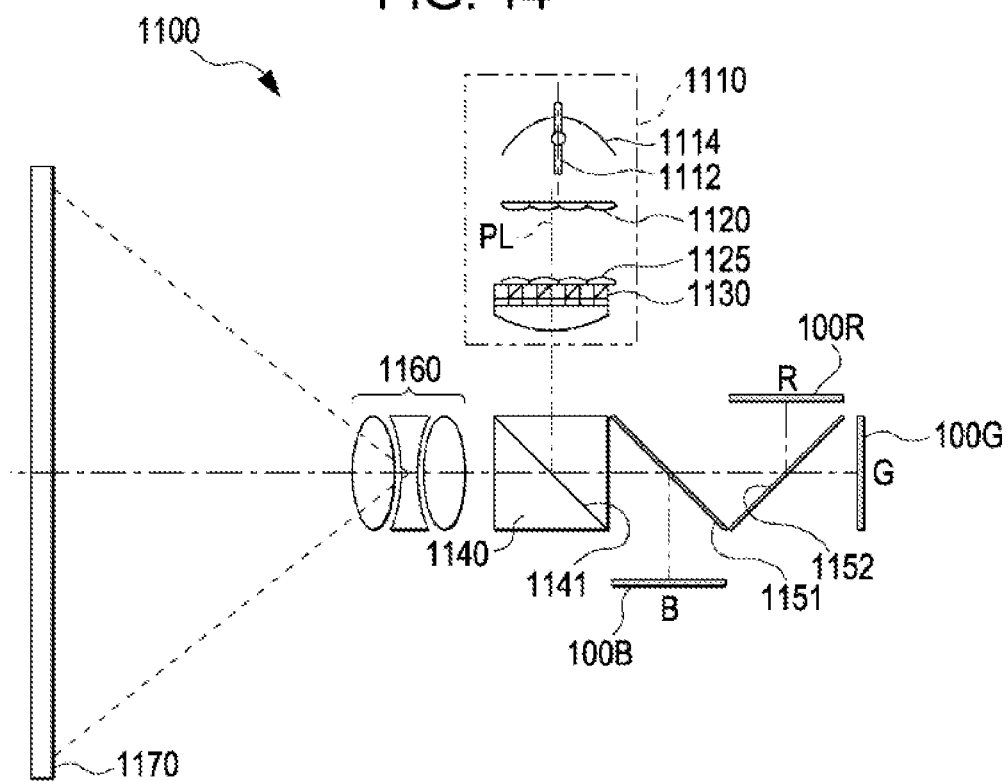
FIG. 14 is a view illustrating an optical configuration of the projector.

FIG. 13 is a diagram showing an external configuration of projector 1100 provided with the display circuit 100 with a light bulb, FIG. 14 is a plan view showing an optical configuration of projector 1100.

As shown in FIG. 14, projector 1100 is a three-plate type in which the display circuit 100 of reflection type corresponds to the respective colors of R (red), G (green), and B (blue). In the inside of projector 1100, polarization lighting system 1110 is disposed along system optical axis PL. In such polarization lighting system 1110, light emitted from lamp 1112 becomes a light beam in substantially parallel reflected by reflector 1114, and is incident on first integrator lens 1120. Light emitted from lamp 1112 is divided into a plurality of intermediate light beam due to such first integrator lens 1120. Such a divided intermediate light beam is converted to one kind of polarized light beam (s polarization light beam) which is substantially aligned in the polarization direction, and is emitted from polarization lighting system 1110 due to polarization conversion element 1130 which has second integrator lens 1125 on the light incidence side.

However, s polarization light beam emitted from polarization lighting system 1110 is reflected by s polarization light beam reflective surface 1141 of polarization beam splitter 1140. Light beam of blue light (B) of the reflected light beams is reflected by a blue light reflection layer of the dichroic mirror 1151, and is modulated upon reflection at a display circuit 100B. In addition, light beam of red light (R) of light beams which penetrated the blue light reflection layer of dichroic mirror 1151 is reflected by a red light reflection layer of dichroic mirror 1152, and is modulated upon reflection at a display circuit 100R. On the other hand, light beam of which penetrated the blue light reflection layer of dichroic mirror 1151, green light (G) of light beams penetrates the red light reflection layer of dichroic mirror 1152 and is modulated upon reflection at a display circuit 100G.

Here, the display circuits 100R, 100G and 100B are the same as the display circuit 100 according to the embodiment described above, and are driven respectively depending on display data Da which corresponds to R, G, and B that is transmitted. That is, in such projector 1100, the display circuit 100 is provided with 3 sets corresponding to each color of R, G, and B, and is configured to be driven respectively depending on display data Da corresponding to each color of R, G, and B.

Red light, green light, and blue light modulated respectively depending on the display circuits 100R, 100G, and 100B are sequentially synthesized by dichroic mirror 1152, 1151 and polarization beam splitter 1140, and thereafter are projected on screen 1170 by projection optical system 1160. Moreover, the display circuits 100R, 100B, and 100G are not provided with color filters since a light beam corresponding to each of primary colors R, G, and B is incident thereon by dichroic mirror 1151 and 1152.

Moreover, as for electronic apparatus, it can be applied to an electronic viewfinder or a head-mounted display or the like in a video camera or interchangeable lens type digital camera as well as the projector described referring to FIGS. 13 and 14.

This application claims priority to Japan Patent Application No. 2012-055389 filed Mar. 13, 2012, the entire disclosures of which are hereby incorporated by reference in their entireties.

What is claimed is:

1. An output control circuit comprising:
a first circuit which includes a plurality of first sub circuits; and
a second circuit which includes a plurality of second sub circuits,
wherein one first sub circuit among the plurality of first sub circuits inputs one input signal and enable signal,
wherein one second sub circuit among the plurality of second sub circuits inputs the enable signal when the enable signal is transmitted from the one first sub circuit,
wherein the one second sub circuit outputs a first output signal,
wherein the one first sub circuit inputs the first output signal,
wherein another second sub circuit different from the one second sub circuit among the plurality of second sub circuits inputs the first output signal, and
wherein the one second sub circuit inhibits the one output signal from becoming an active level when the output signal of the other second sub circuit is at an active level.

2. The output control circuit according to claim 1, wherein the one first sub circuit includes:
a logical circuit which inputs the one input signal and the one output signal; and
a switch which takes either of two states of on or off state in response to an output signal of the logical circuit in the middle of the course where the enable signal is supplied to the second sub circuit.

3. The output control circuit according to claim 1,
wherein the one first sub circuit includes a logical circuit that outputs a second output signal based on one of the first output signal and the another input signal.

4. The output control circuit according to claim 3,
wherein an input signal input to the logical circuit is a signal transmitted from a shift register.

5. A scanning line driving circuit which drives each of scanning lines, comprising:
a shift register which causes a pulse signal which becomes an active level in a mutually exclusive manner to be sequentially output corresponding to each of the scanning lines; and
an output control circuit according to claim 1 which is provided for each of a predetermined number of the scanning lines,
wherein the output control circuit inputs an enable signal and a pulse signal corresponding to the predetermined number of the scanning lines so as to be transmitted to the corresponding scanning line.

6. An electro-optic device comprising:
a pixel corresponding to an intersection of a scanning line and a data line; and
the scanning line driving circuit according to claim 5 which drives the scanning line.

7. An electronic apparatus comprising:
the electro-optic device according to claim 6.

8. An output control circuit comprising:
a first circuit including a plurality of first sub circuits in which at least one first sub circuit among the plurality of first sub circuits inputs a first input signal and an enable signal and at least another first sub circuit among the plurality of first sub circuits inputs another input signal and the enable signal; and
a second circuit including a plurality of second sub circuits in which one second sub circuit among the plurality of second sub circuits inputs the enable signal when the enable signal is transmitted from one of the two first sub circuits,
wherein a second sub circuit other than the one second sub circuit among the plurality of second sub circuits inputs an output signal from the one second sub circuit.

9. The output control circuit according to claim 8,
wherein one of the two first sub circuits inputs one of a first output signal output from the one second sub circuit and the another input signal.

10. A scanning line driving circuit which drives each of scanning lines, comprising:
a shift register which causes a pulse signal which becomes an active level in a mutually exclusive manner to be sequentially output corresponding to each of the scanning lines; and
an output control circuit according to claim 8 which is provided for each of a predetermined number of the scanning lines,
wherein the output control circuit inputs an enable signal and a pulse signal corresponding to the predetermined number of the scanning lines so as to be transmitted to the corresponding scanning line.

11. An electro-optic device comprising:
a pixel corresponding to an intersection of a scanning line and a data line; and
the scanning line driving circuit according to claim 10 which drives the scanning line.

12. An electronic apparatus comprising:
the electro-optic device according to claim 11.

* * * * *